United States Patent
Matsuda

(10) Patent No.: US 11,061,517 B2
(45) Date of Patent: Jul. 13, 2021

(54) INPUT DEVICE

(71) Applicant: Alps Alpine Co., Ltd., Tokyo (JP)

(72) Inventor: Atsushi Matsuda, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 23 days.

(21) Appl. No.: 16/797,874

(22) Filed: Feb. 21, 2020

(65) Prior Publication Data

US 2020/0192527 A1 Jun. 18, 2020

Related U.S. Application Data

(63) Continuation of application No. PCT/JP2018/030265, filed on Aug. 14, 2018.

(30) Foreign Application Priority Data

Aug. 29, 2017 (JP) .............................. JP2017-164888

(51) Int. Cl.
*G06F 3/041* (2006.01)
*G06F 3/044* (2006.01)
*H03K 17/955* (2006.01)

(52) U.S. Cl.
CPC .......... *G06F 3/0443* (2019.05); *G06F 3/0446* (2019.05); *G06F 3/04162* (2019.05); *H03K 17/955* (2013.01); *G06F 2203/04101* (2013.01)

(58) Field of Classification Search
CPC ... G06F 3/0443; G06F 3/0446; G06F 3/04162
USPC ................................................. 345/173–174
See application file for complete search history.

(56) References Cited

U.S. PATENT DOCUMENTS

| | | | | |
|---|---|---|---|---|
| 9,360,512 B2* | 6/2016 | Luong | ................. | G01R 35/005 |
| 2006/0017705 A1* | 1/2006 | Yoshikawa | ............. | G06F 3/045 |
| | | | | 345/173 |
| 2010/0044122 A1* | 2/2010 | Sleeman | ........... | G06F 3/041661 |
| | | | | 178/18.06 |
| 2011/0279169 A1 | 11/2011 | Salaverry | | |
| 2011/0279409 A1 | 11/2011 | Salaverry et al. | | |
| 2012/0032895 A1 | 2/2012 | Westerman et al. | | |

(Continued)

FOREIGN PATENT DOCUMENTS

WO 2016/021356 2/2016

OTHER PUBLICATIONS

International Search Report and Written Opinion from International Application No. PCT/JP2018/030265 dated Sep. 11, 2018.

*Primary Examiner* — Kwin Xie
(74) *Attorney, Agent, or Firm* — Beyer Law Group LLP

(57) ABSTRACT

A capacitance detection part simultaneously receive input of electric charges stored at one electrode, from a plurality of terminals provide to the one electrode. As a result of the simultaneous input, partial electric charges stored between an object and an overlapping portion of one electrode overlapping one segment are distributed as distribution electric charges to each of the plurality of terminals in accordance with a conductance from the overlapping portion to each of the plurality of terminals. The capacitance detection part generates detection data corresponding to the distribution electric charges, for each of N terminals. The element data configuration part configures M pieces of element data corresponding to M segments, on the basis of the N pieces of detection data.

11 Claims, 21 Drawing Sheets

(56) References Cited

U.S. PATENT DOCUMENTS

| | | | |
|---|---|---|---|
| 2015/0002461 A1* | 1/2015 | Guarneri | G06F 3/04886 345/174 |
| 2015/0091859 A1* | 4/2015 | Rosenberg | G06F 3/0445 345/174 |
| 2016/0170530 A1* | 6/2016 | Lee | G06F 3/0446 345/174 |
| 2016/0209956 A1* | 7/2016 | Besshi | G06F 3/0338 |
| 2016/0364074 A1* | 12/2016 | Dorfner | G06F 3/0448 |
| 2017/0139544 A1 | 5/2017 | Yamada et al. | |
| 2018/0314380 A1* | 11/2018 | Uehara | G06F 3/0412 |

* cited by examiner

FIG. 5

$$
\begin{array}{ccccccccc}
& & P_1 & & P_2 & \cdots & P_j & \cdots & P_M \\
& & \| & & \| & & \| & & \| \\
S_1 & = & U_{11} & + & U_{12} & + \cdots + & U_{1j} & + \cdots + & U_{1M} \\
& & + & & + & & + & & + \\
S_2 & = & U_{21} & + & U_{22} & + \cdots + & U_{2j} & + \cdots + & U_{2M} \\
& & + & & + & & + & & + \\
\vdots & & \vdots & & \vdots & & \vdots & & \vdots \\
& & + & & + & & + & & + \\
S_i & = & U_{i1} & + & U_{i2} & + \cdots + & U_{ij} & + \cdots + & U_{iM} \\
& & + & & + & & + & & + \\
\vdots & & \vdots & & \vdots & & \vdots & & \vdots \\
& & + & & + & & + & & + \\
S_N & = & U_{N1} & + & U_{N2} & + \cdots + & U_{Nj} & + \cdots + & U_{NM} \\
\end{array}
$$

FIG. 6

$$S_1 = P_1 \times K_{11} + P_2 \times K_{12} + \cdots + P_j \times K_{1j} + \cdots + P_M \times K_{1M}$$
$$S_2 = P_1 \times K_{21} + P_2 \times K_{22} + \cdots + P_j \times K_{2j} + \cdots + P_M \times K_{2M}$$
$$\vdots$$
$$S_i = P_1 \times K_{i1} + P_2 \times K_{i2} + \cdots + P_j \times K_{ij} + \cdots + P_M \times K_{iM}$$
$$\vdots$$
$$S_N = P_1 \times K_{N1} + P_2 \times K_{N2} + \cdots + P_j \times K_{Nj} + \cdots + P_M \times K_{NM}$$

where each column sum equals $P_1, P_2, \ldots, P_j, \ldots, P_M$.

FIG. 7

$$SA_1 = PA_1 \times K_{11} + PA_2 \times K_{12} + \cdots + PA_j \times K_{1j} + \cdots + PA_M \times K_{1M}$$
$$+ SA_2 = PA_1 \times K_{21} + PA_2 \times K_{22} + \cdots + PA_j \times K_{2j} + \cdots + PA_M \times K_{2M}$$
$$\vdots$$
$$SA_i = PA_1 \times K_{i1} + PA_2 \times K_{i2} + \cdots + PA_j \times K_{ij} + \cdots + PA_M \times K_{iM}$$
$$\vdots$$
$$SA_N = PA_1 \times K_{N1} + PA_2 \times K_{N2} + \cdots + PA_j \times K_{Nj} + \cdots + PA_M \times K_{NM}$$

with $PA_1, PA_2, \ldots, PA_j, \ldots, PA_M$ at top.

INPUT DEVICE

CLAIM OF PRIORITY

This application is a Continuation of International Application No. PCT/JP2018/030265 filed on Aug. 14, 2018, which claims benefit of Japanese Patent Application No. 2017-164888 filed on Aug. 29, 2017. The entire contents of each application noted above are hereby incorporated by reference.

BACKGROUND OF THE INVENTION

1. Field of the Invention

The present invention relates to an input device used for inputting information in an information apparatus such as a computer or a smart phone, and, for example, relates to an input device that identifies a region where an object such as a finger or a pen approaches an operation surface, and inputs information on the basis of the identified region.

2. Description of the Related Art

Input devices such as a touch pad and a touch panel that identify a contact position of a finger on the basis of a change in capacitance and input information, are generally an image sensing type capable of simultaneously detecting a plurality of contact positions.

In addition, a type that detects a change in capacitance includes a mutual-capacitance type that detects a change in capacitance between two electrodes, and a self-capacitance type that detects a capacitance between an electrode and a ground. To realize, for example, a hovering function of detecting an operation with a finger at a position away from an operation surface, a self-capacitance sensor with high detection sensitivity for capacitance is advantageous.

However, since a general self-capacitance sensor detects a capacitance at one location with one electrode, when the self-capacitance sensor is applied to an image sensing type, the number of electrodes increases to a very large number as the resolution increases. To deal with this problem, International Publication No. WO2016/021356 discloses an input device that configures data (element data) of capacitances at a plurality of segments provided on an operation surface, on the basis of data (detection data) of capacitances detected with electrodes the number of which is smaller than the number of the segments. To configure m element data from n (m>n) detection data, data configuration processing is repeatedly performed. In each data configuration processing, provisional detection data is calculated from provisional element data, and the provisional element data is corrected on the basis of comparison between the provisional detection data and actual detection data.

In the input device disclosed in International Publication No. WO2016/021356, the above-described data configuration processing is performed using information about an area ratio of electrodes in each of m segments. In the data configuration processing, the resistance of each electrode is not taken into consideration (the resistance is regarded as zero), and thus the resistance of each electrode is desirably as small as possible.

Meanwhile, to increase the accuracy of calculation of element data in the above-described data configuration processing, the quantity of information of capacitance obtained from each segment is desirably increased. For this, it is necessary to increase the number of electrodes having overlapping portions in each segment, which increases the density of electrode wiring on a substrate.

To achieve high-density and low-resistance wiring on a printed board, most simply, the number of wiring layers may be increased and wires in the respective layers may be connected by vias. However, when the number of wiring layers is increased, the cost of the printed board is increased. In addition, when the number of through holes for the vias is increased, it is difficult to dispose components on the back surface of the printed board. When vias such as IVH (Interstitial Via Hole) having no through holes are used, the cost of the printed board is further increased.

SUMMARY OF THE INVENTION

The present invention provides an input device that, in the case where electrodes for detecting a capacitance have a relatively large resistance, is capable of accurately configuring element data indicating capacitances at a plurality of segments on an operation surface, from detection data the number of which is smaller than the number of the segments.

An input device according to one aspect of the present invention is an input device for inputting information corresponding to approach of an object to an operation surface. The input device includes: a plurality of electrodes each having a plurality of terminals and having N terminals as a whole; a capacitance detection part configured to receive input of electric charges stored between the object approaching the operation surface and the electrodes, from the N terminals, and generate detection data corresponding to a capacitance between the object and the electrode, for each of the N terminals, on the basis of the inputted electric charges; and an element data configuration part configured to configure M (M indicates an integer larger than N) pieces of element data indicating degrees of approach of the object in respective M segments into which the operation surface is virtually divided, on the basis of the N pieces of detection data. Each of the M segments overlaps one or more of the electrodes. The capacitance detection part simultaneously receives input of the electric charges stored at one of the electrodes from the plurality of terminals provided to the one of the electrodes, and, as a result of the simultaneous input, partial electric charges stored between the object and an overlapping portion of the one of the electrodes overlapping one of the segments are distributed as distribution electric charges to each of the plurality of terminals in accordance with a conductance from the overlapping portion to each of the plurality of terminals. The capacitance detection part generates the detection data corresponding to the distribution electric charges, for each of the N terminals.

In the input device, the plurality of terminals are provided to one of the electrodes, and the N terminals are provided as a whole. In addition, each of the M segments into which the operation surface is virtually divided overlaps one or more of the electrodes. In the capacitance detection part, the electric charges stored at one of the electrodes are simultaneously inputted from the plurality of terminals provided to the one of the electrodes. As a result of the simultaneous input, the partial electric charges stored between the object and the overlapping portion of one of the electrodes overlapping one of the segments are distributed as distribution electric charges to each of the plurality of terminals in accordance with a conductance from the overlapping portion to each of the plurality of terminals. In the capacitance detection part, the detection data corresponding to the distribution electric charges is generated for each of the N terminals. In the element data configuration part, the M pieces of element data indicating degrees of approach of the object at the respective M segments are configured on the basis of the N pieces of detection data. Therefore, even when each of the electrodes has relatively high resistance, the element data for each segment are accurately configured.

In addition, in the input device, as the number of the electrodes is smaller than the number of the detection data, the density of wiring of the electrodes is reduced, and thus the configuration is simplified.

Furthermore, in the input device, at least some of the plurality of electrodes include first partial electrodes each provided within one of the segments and formed from a first conductive material, and second partial electrodes each provided between the two first partial electrodes belonging to the two adjacent segments and formed from a second conductive material having lower conductivity than the first conductive material.

According to this configuration, since the electrode is formed by combining the first partial electrodes formed from the first conductive material having high conductivity and the second partial electrodes formed from the second conductive material having low conductivity, even when the types of the first conductive material and the second conductive material to be used are limited, the electrodes having desired conductivity are easily formed.

Moreover, the first partial electrode is provided within one of the segments, and the second partial electrode is provided between the two first partial electrodes belonging to the two adjacent segments. Accordingly, the second partial electrode having low conductivity is not isolated within the segment, and the electrode is not divided within the segment such that flow of electric charges is not blocked. Thus, variations in the distribution electric charges corresponding to a position, within the segment, close to the object are easily reduced.

Preferably, the input device may include a substrate on which the plurality of electrodes are provided. At least one intersection portion at which two of the electrodes intersect each other may be formed on the substrate. At the intersection portion, the first partial electrode may be provided in one of the electrodes located closer to the substrate than the other of the electrodes.

According to this configuration, it is possible to form the first partial electrode provided in the one of the electrodes at the intersection portion, on the surface of the substrate from metal foil having high conductivity such as copper foil, and thus the thickness of the intersection portion is easily reduced.

Preferably, the other of the electrodes may be formed from the second conductive material. Accordingly, the structure of the other of the electrodes is simplified.

In this case, the segments may each have a rectangular shape, and the M segments may be arranged in a matrix. The plurality of electrodes may include a plurality of row-direction electrodes extending in a row direction in the matrix arrangement of the segments, and a plurality of column-direction electrodes extending in a column direction in the matrix arrangement of the segments. The column-direction electrodes may each include the first partial electrode and the second partial electrode. The row-direction electrodes may each be the other of the electrodes at the intersection portion.

Preferably, the second partial electrode may be provided in the other of the electrodes at the intersection portion. Accordingly, the other of the electrodes is formed by a combination of the first partial electrode and the second partial electrode, and thus the other of the electrodes easily has desired conductivity.

In this case, the segments may each have a rectangular shape, and the M segments may be arranged in a matrix. The plurality of electrodes may include a plurality of row-direction electrodes extending in a row direction in a matrix arrangement of the segments, and a plurality of column-direction electrodes extending in a column direction in the matrix arrangement of the segments. The row-direction electrodes and the column-direction electrodes may each include the first partial electrode and the second partial electrode. The row-direction electrodes may each be the other of the electrodes at the intersection portion. The column-direction electrodes may each be the one of the electrodes at the intersection portion.

Preferably, each of the M pieces of element data may be the sum of partial element data distributed at a predetermined proportion to each of the N pieces of detection data. Each of the N pieces of detection data may be approximated to the sum of the partial element data distributed at the predetermined proportion from each of the M pieces of element data. The element data configuration part may repeat, a plurality of times, data configuration processing in which assumed values of the N pieces of detection data are each calculated as the sum of the partial element data distributed at the predetermined proportion from each of assumed values of the M pieces of element data, and the assumed values of the M pieces of element data are corrected on the basis of the N predetermined proportions set for the respective M pieces of element data such that the calculated assumed values of the N pieces of detection data approach the N pieces of detection data. One of the partial element data may be approximated to the distribution electric charges distributed to one of the terminals as a result of the simultaneous input. One of the element data may be approximated to combined electric charges obtained by combining all the partial electric charges stored at the overlapping portions of all the electrodes in one of the segments.

According to this configuration, each of the M pieces of element data is the sum of the partial element data distributed at the predetermined proportion to each of the N pieces of detection data, and each of the N pieces of detection data is approximated to the sum of the partial element data distributed at the predetermined proportion from each of the M pieces of element data. That is, transformation from the M pieces of element data to the N pieces of detection data is defined by the N predetermined proportions set for each of the M pieces of element data.

In the data configuration processing, the assumed values of the N pieces of detection data are each calculated as the sum of the partial element data distributed at the predetermined proportion from each of the assumed values of the M pieces of element data. In addition, the assumed values of the M pieces of element data are corrected on the basis of the N predetermined proportions set for each of the M pieces of element data such that the calculated assumed values of the N pieces of detection data approach the N pieces of detection data. By repeating the data configuration processing, a convergence value of the element data suitable for the N pieces of detection data is obtained.

Preferably, one of the predetermined proportions may have a value corresponding to an area ratio of the overlapping portion of one of the electrodes overlapping one of the segments and the overlapping portions of all the electrodes overlapping the one of the segments, and a ratio of a conductance from one of the terminals to the overlapping portion in the one of the electrodes and conductances from all the terminals in the one of the electrodes to the overlapping portion.

Preferably, the data configuration processing may include: a first process of transforming the assumed values of the M pieces of element data to the assumed values of the N pieces of detection data on the basis of the N predetermined proportions set for each of the M pieces of element data; a second process of calculating N first coefficients indicating multiplication factors by which the assumed values of the N pieces of detection data are multiplied to cause the assumed values of the N pieces of detection data to be equal to the N pieces of detection data; a third process of transforming the N first coefficients to M second coefficients indicating multiplication factors by which the M pieces of element data are multiplied, on the basis of the N predetermined proportions set for each of the M pieces of element data; and a fourth process of correcting the assumed values of the M pieces of element data on the basis of the M second coefficients.

Preferably, in the first process, the element data configuration part may transform a matrix including the assumed values of the M pieces of element data as components to a matrix including the assumed values of the N pieces of detection data as components on the basis of a first transformation matrix including M×N components corresponding to the M pieces of element data and the N pieces of detection data and including, as one component, the predetermined proportion for one of the partial element data distributed from one of the element data to one of the detection data.

Preferably, in the third process, the element data configuration part may transform a matrix including the N first coefficients as components to a matrix including the M second coefficients as components, on the basis of a second transformation matrix including M×N components corresponding to the M pieces of element data and the N pieces of detection data and including, as one component, the predetermined proportion for one of the partial element data distributed from one of the element data to one of the detection data.

BRIEF DESCRIPTION OF THE DRAWINGS

FIG. 2A shows the plurality of segments, and FIG. 2B shows overlapping of segments and a detection region;

FIG. 5 illustrates a relationship between N pieces of detection data and M pieces of partial element data;

FIG. 6 is a diagram for describing transformation of the M pieces of element data to N pieces of detection data;

FIG. 7 is a diagram for describing transformation of assumed values of the M pieces of element data to assumed values of the N pieces of detection data;

FIG. 11A shows a plurality of segments on the operation surface, and FIG. 11B shows a pattern of electrodes overlapping each segment;

FIG. 12A shows a pattern of electrodes passing through the upper side of intersection portions, and FIG. 12B shows a pattern of electrodes passing through the lower side of the intersection portions;

FIG. 13A is a plan view, and FIG. 13B is a cross-sectional view taken along a line XIIIB-XIIIB;

FIG. 14A shows a plurality of segments on the operation surface, and FIG. 14B shows a pattern of electrodes overlapping each segment;

FIG. 15A shows a pattern of electrodes passing through the upper side of intersection portions, and FIG. 15B shows a pattern of electrodes passing through the lower side of the intersection portions;

FIG. 16A shows a plurality of segments on an operation surface, and FIG. 16B shows a pattern of electrodes overlapping each segment;

FIG. 17A shows a pattern of electrodes passing through the upper side of intersection portions, and FIG. 17B shows a pattern of electrodes passing through the lower side the intersection portions;

FIG. 18A is a plan view, and FIG. 18B is a cross-sectional view taken along a line XVIIIB-XVIIIB;

FIG. 19A shows a plurality of segments on an operation surface, and FIG. 19B shows a pattern of electrodes overlapping each segment;

FIG. 20A shows a pattern of electrodes passing through the upper side of intersection portions, and FIG. 20B shows a pattern of electrodes passing through the lower side of the intersection portions; FIG. 21A is a plan view, and FIG. 21B is a cross-sectional view taken along a line XXIB-XXIB.

DESCRIPTION OF THE PREFERRED EMBODIMENTS

First Embodiment

Figure 1:
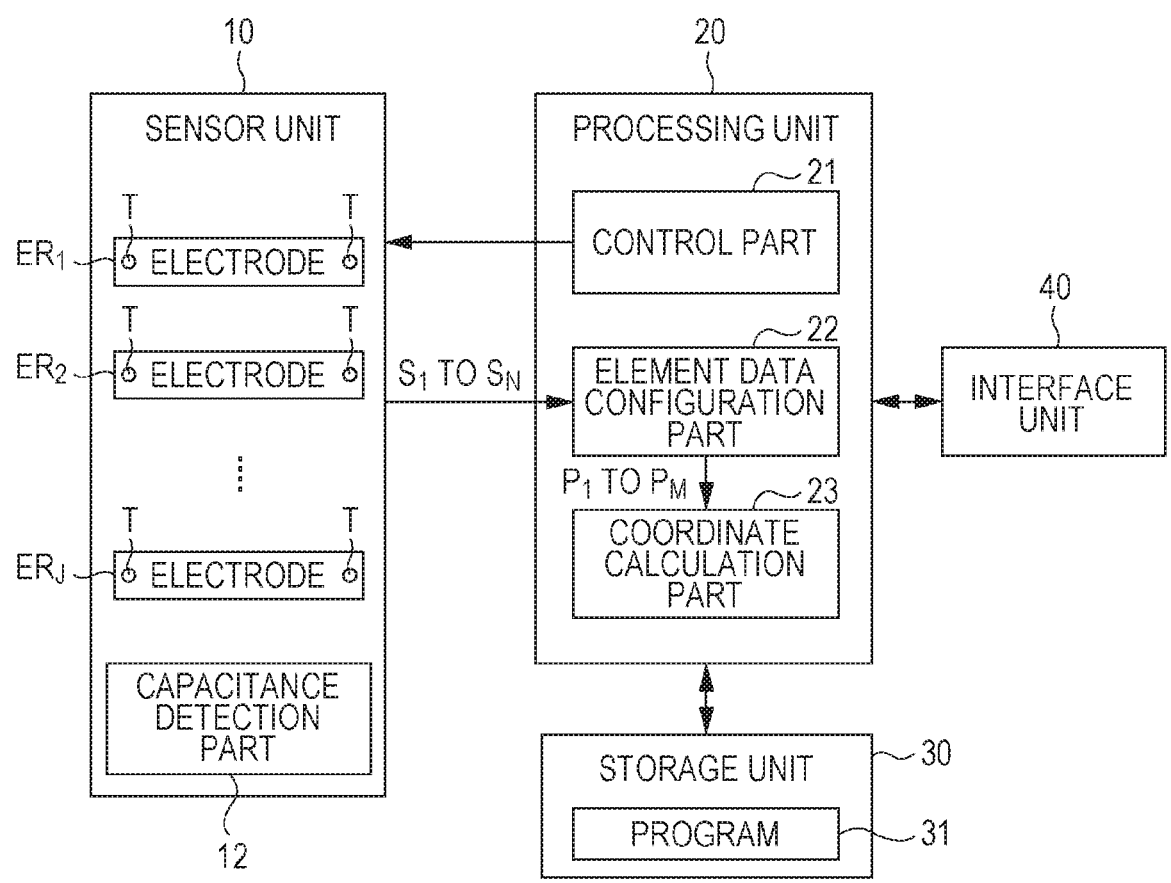
FIG. 1 is a diagram showing an example of the configuration of an input device according to a first embodiment.

FIG. 1 is a diagram showing an example of the configuration of an input device according to a first embodiment of the present invention. The input device shown in FIG. 1 includes a sensor unit 10, a processing unit 20, a storage unit 30, and an interface unit 40. The input device according to the present embodiment is a device that, when an object such as a finger or a pen approaches an operation surface provided with a sensor, inputs information corresponding to the position of the approach. In the present specification, the term "approach" means being close, and does not limit presence/absence of contact.

Sensor Unit 10

The sensor unit 10 detects a degree of approach of an object (such as a finger or a pen) in each of a plurality of detection regions on an operation surface 11 and generates N pieces of detection data S1 to SN as a whole. The sensor unit 10 generates one or more detection data Si for each detection region. "i" represents an integer from 1 to N. In the following description, the N pieces of detection data S1 to SN may each be described as "detection data S" without being distinguished from each other.

In the example in FIG. 1, the sensor unit 10 has J electrodes ER1 to ERJ provided in J detection regions. In the following description, the J electrodes ER1 to ERJ may each be described as "electrode ER" without being distinguished from each other. Each electrode ER has a plurality of terminals T, and the J electrodes ER have N terminals T as a whole. In the example in FIG. 1, each electrode ER has two terminals T, and thus the number J of the electrodes ER is half the number N of the terminals T. In another example of the present embodiment, an electrode ER having three or more terminals T may be present.

Figure 2A:
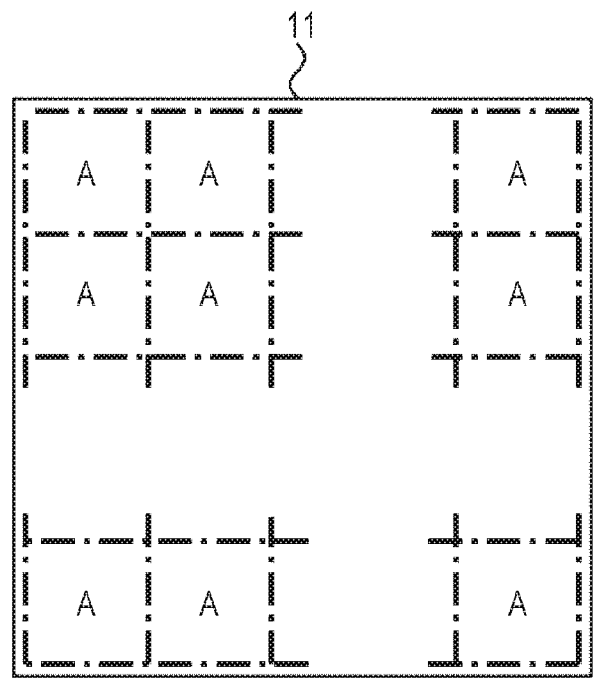
FIGS. 2A and 2B illustrate a plurality of segments into which an operation surface is virtually divided, where
Figure 2B:
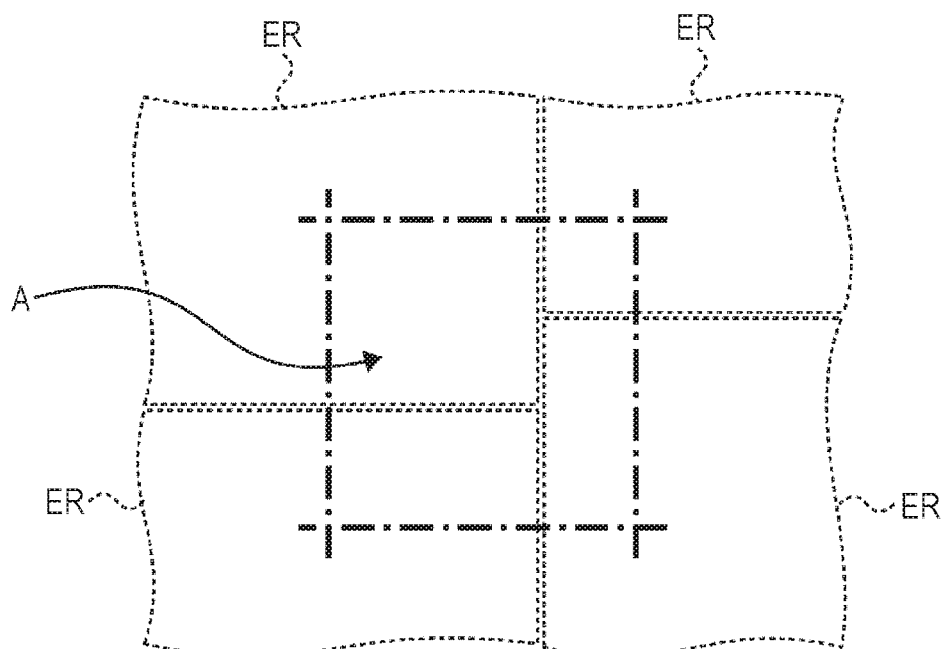

The operation surface 11 of the sensor unit 10 is virtually divided into a plurality of segments A as shown in FIG. 2A. In the example in FIG. 2A, the plurality of segments A are demarcated in a lattice pattern. In addition, each of the plurality of segments A overlaps a plurality of electrodes ER. In the example in FIG. 2B, one segment A overlaps four electrodes ER. Therefore, the sensor unit 10 generates a plurality of detection data S indicating degrees of approach of an object, for each of the plurality of segments A. In the following, the number of the segments A is M (M>N). In addition, the segments A may each be described as "segment Aj" to distinguish each of the segments A. "j" represents an integer from 1 to M.

The input device according to the present embodiment configures M pieces of element data P1 to PM indicating degrees of approach in the M segments A1 to AM, respectively, on the basis of the N pieces of detection data S1 to SN obtained in the sensor unit 10.

In the example in FIG. 1, the sensor unit 10 includes a capacitance detection part 12. The capacitance detection part 12 detects a change in capacitance due to an object (such as a finger or a pen) approaching the electrodes ER1 to ERJ on the operation surface 11. The capacitance detection part 12 receives input of electric charges stored between the object that approaches the operation surface 11 and the electrodes ER, from the N terminals T, and generates detection data S corresponding to the capacitance between the object and the electrode ER, for each of the N terminals T on the basis of the inputted electric charges.

In addition, when the capacitance detection part 12 receives input of electric charges stored on one electrode ER, the capacitance detection part 12 simultaneously receives input of electric charges from the plurality of terminals T provided to the one electrode ER. Thus, the electric charges stored on the electrode ER are distributed to the plurality of terminals T. At this time, the ratio of distribution of electric charges is expected to be proportional to the conductance (the inverse of a resistance value) from a location where the electric charges are stored on the electrode ER, to each terminal T. That is, more electric charges are distributed to a terminal T having a higher conductance.

Figure 3:
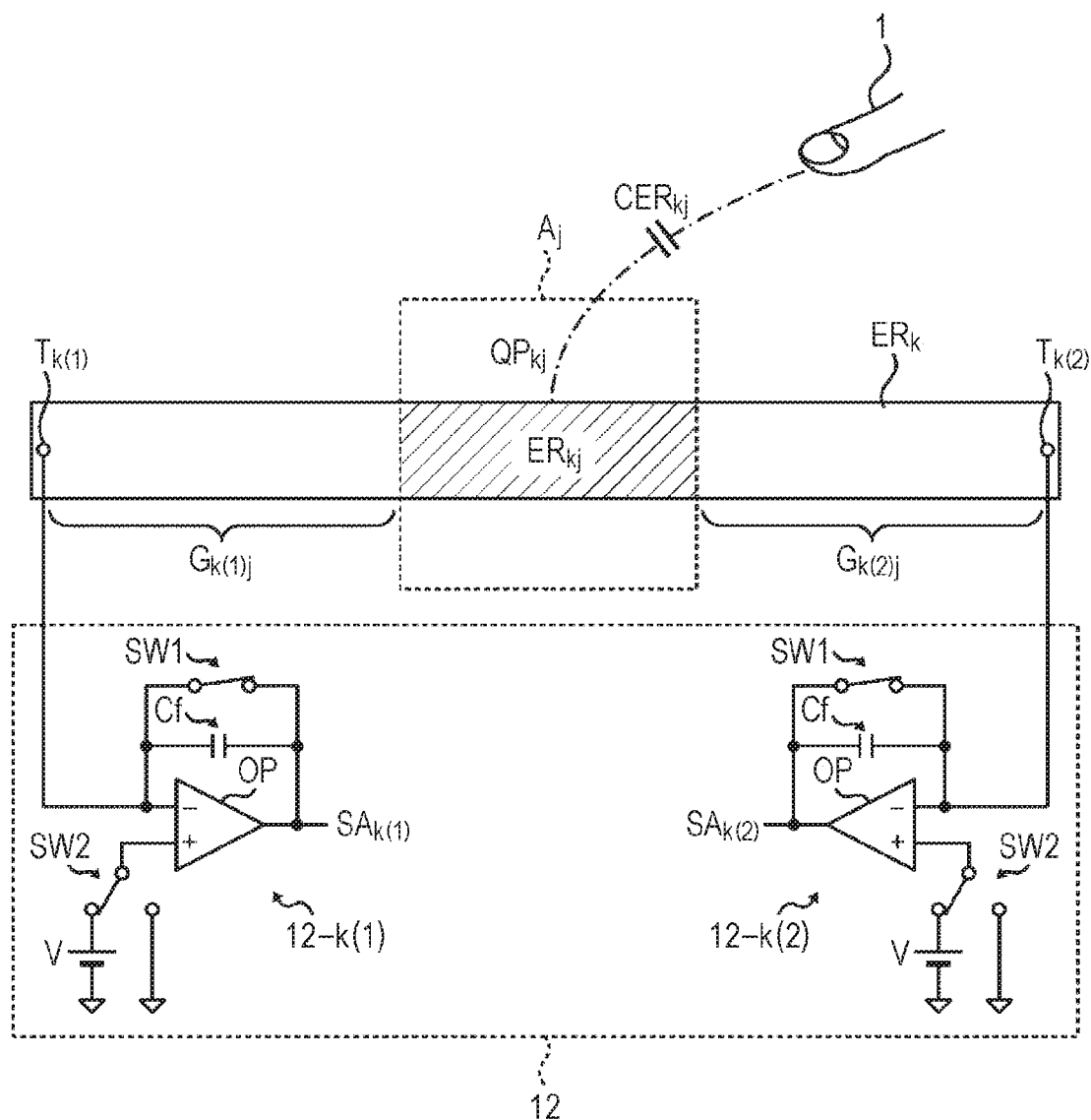
FIG. 3 is a diagram showing a state where electric charges are stored between an object and an overlapping portion of one electrode overlapping one segment.
Figure 4:
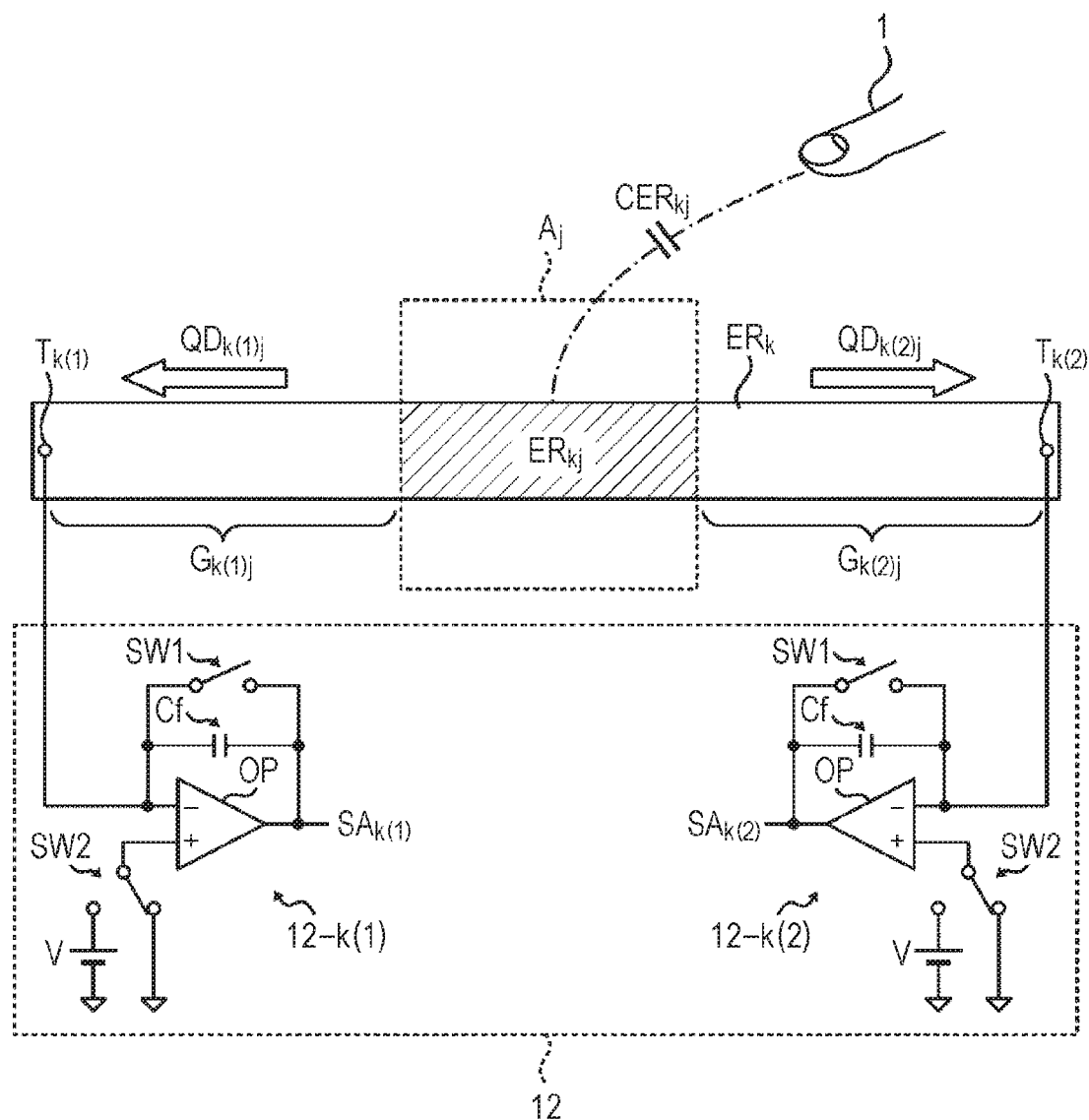
FIG. 4 is a diagram showing a state where electric charges stored on one electrode on one segment are distributed to two terminals.

FIG. 3 is a diagram showing a state where partial electric charges QPkj are stored between an object 1 and an overlapping portion ERkj of one electrode ERk overlapping one segment Aj. FIG. 4 is a diagram showing a state where the partial electric charges QPkj are distributed to two terminals Tk(1) and Tk(2) of the electrode ERk. "k" represents an integer from 1 to J. In addition, "k(1)" and "k(2)" each represent an integer from 1 to N associated with the integer k.

In FIGS. 3 and 4, "Gk(1)j" represents the conductance from the overlapping portion ERkj to the terminal Tk(1), and "Gk(2)j" represents the conductance from the overlapping portion ERkj to the terminal Tk(2). In addition, "CERkj" represents the capacitance between the overlapping portion ERkj and the object 1.

In FIG. 4, "QDk(1)j" represents distribution electric charges distributed to the terminal Tk(1) among the partial electric charges QPkj. In addition, "QDk(2)j" represents distribution electric charges distributed to the terminal Tk(2) among the partial electric charges QPkj.

The capacitance detection part 12 includes two charge amplifiers 12-k(1) and 12-k(2) that simultaneously receive input of electric charges from the two terminals Tk(1) and Tk(2). The charge amplifiers 12-k(1) and 12-k(2) each include an operational amplifier OP, a capacitor Cf, and switches SW1, SW2. The capacitor Cf and the switch SW1 are connected in parallel between the output terminal and the inverted input terminal of the operational amplifier OP. The switch SW2 selectively inputs a ground potential or a driving voltage V to the non-inverted input terminal of the operational amplifier. The inverted input terminal of the operational amplifier OP is connected to a corresponding terminal T of the electrode ERkj.

In the state in FIG. 3, the switches SW1 of the charge amplifiers 12-k(1) and 12-k(2) are turned on, and the switches SW2 of the charge amplifiers 12-k(1) and 12-k(2) input the driving voltage V to the non-inverted input terminals of the operational amplifiers. Accordingly, the driving voltage V is applied to the two terminals Tk(1) and Tk(2), and partial electric charges QPkj are stored between the overlapping portion ERkj and the object 1.

In the state in FIG. 4, the switches SW1 of the charge amplifiers 12-k(1) and 12-k(2) are simultaneously turned off, and the switches SW2 of the charge amplifiers 12-k(1) and 12-k(2) simultaneously input the ground potential to the non-inverted input terminals of the operational amplifiers. Accordingly, electric charges are transferred to the charge amplifiers 12-k(1) and 12-k(2) such that the two terminals Tk(1) and Tk(2) have the ground potential. The transfer of electric charges is substantially simultaneously started.

The partial electric charges QPkj are the sum of the distribution electric charges QDk(1)j distributed to the terminal Tk(1) and the distribution electric charges QDk(2)j distributed to the terminal Tk(2), and the following equation is established.

$$QPkj=QDk(1)j+QDk(2)j \qquad (1)$$

The distribution electric charges QDk(1)j and QDk(2)j are proportional to the conductances Gk(1)j and Gk(2)j from the overlapping portion ERkj to the two terminals Tk(1) and Tk(2). When coefficients indicating a conductance ratio are denoted by "KGk(1)j" and "KGk(2)j", the distribution electric charges QDk(1)j and QDk(2)j are represented by the following equations, respectively.

$$QDk(1)j = KGk(1)j \times QPkj \quad (2\text{-}1)$$

$$QDk(2)j = KGk(2)j \times QPkj \quad (2\text{-}2)$$

The coefficients KGk(1)j and KGk(2)j are represented by the following equations with the conductances Gk(1)j and Gk(2)j.

$$KG_{k(1)j} = \frac{G_{k(1)j}}{(G_{k(1)j} + G_{k(2)j})} \quad (3\text{-}1)$$

$$KG_{k(2)j} = \frac{G_{k(2)j}}{(G_{k(2)j} + G_{k(2)j})} \quad (3\text{-}2)$$

In addition, combined electric charges obtained by combining all the partial electric charges QPkj stored on overlapping portions ERkj of all the electrodes ERk overlapping the segment Aj are denoted by "Qj". The combined electric charges Qj are represented by the following equation.

$$Q_j = \sum_{k=1}^{J} QP_{kj} \quad (4)$$

The partial electric charges QPkj are proportional to the capacitance CERkj between the object 1 and the overlapping portion ERkj in the segment Aj, and the capacitance CERkj is substantially proportional to the area of the overlapping portion ERkj. Therefore, when the area ratio of the overlapping portion ERkj of the electrode ERk overlapping the segment Aj and the overlapping portions of all the electrodes is denoted by "KSkj", the partial electric charges QPkj are represented by the following equation.

$$QPkj = KSkj \times Qj \quad (5)$$

When Equation (5) is substituted into Equations (2-1) and (2-2), the following equations are obtained.

$$QDk(1)j = KGk(1)j \times KSkj \times Qj \quad (6\text{-}1)$$

$$QDk(2)j = KGk(2)j \times KSkj \times Qj \quad (6\text{-}2)$$

When the coefficients multiplied by the combined electric charges Qj in Equations (6-1) and (6-2) are replaced with "Kk(1)j" and "Kk(2)j", these coefficients are represented by the following equations, respectively.

$$Kk(1)j = KGk(1)j \times KSkj \quad (7\text{-}1)$$

$$Kk(2)j = KGk(2)j \times KSkj \quad (7\text{-}2)$$

Since "k(1)" and "k(2)" are integers from 1 to N, when these integers are replaced with an integer i, Equations (7-1) and (7-2) are represented by the following equation.

$$Kij = KGij \times KSkj \quad (8)$$

When Equation (8) is substituted into Equations (6-1) and (6-2), distribution electric charges QDij are represented by the following equation.

$$QDij = Kij \times Qj \quad (9)$$

When detected electric charges inputted from a terminal Ti to the capacitance detection part 12 are denoted by "QDi", the detected electric charges QDi are the sum of all the distribution electric charges QDij related to the terminal Ti, and thus the following equation is obtained.

$$QD_i = \sum_{j=1}^{M} QD_{ij} \quad (10)$$

When Equation (9) is substituted into Equation (10), the following equation is obtained.

$$QD_i = \sum_{j=1}^{M} K_{ij} Q_j \quad (11)$$

It is possible to represent Equation (11) using a matrix as follows.

$$\underbrace{\begin{bmatrix} K_{11} & K_{12} & \cdots & K_{1M} \\ K_{21} & & & K_{2M} \\ \vdots & & & \vdots \\ K_{N1} & K_{N2} & \cdots & K_{NM} \end{bmatrix}}_{K} \begin{bmatrix} Q_1 \\ Q_2 \\ \vdots \\ Q_M \end{bmatrix} = \begin{bmatrix} QD_1 \\ QD_2 \\ \vdots \\ QD_N \end{bmatrix} \quad (12)$$

In addition, the combined electric charges Qj in the segment Aj are the sum of all the distribution electric charges QDij related to the segment Aj and thus are represented by the following equation.

$$Q_j = \sum_{i=1}^{N} QD_{ij} \quad (13)$$

Meanwhile, the input device according to the present embodiment configures M pieces of element data P1 to PM on the basis of N pieces of detection data S1 to SN (hereinafter, the M pieces of element data P1 to PM are sometimes described as "element data P" without being distinguished from each other). Element data Pj of the segment Aj corresponds to a capacitance CERj between an object and the overlapping portions of all the electrodes ER overlapping the segment Aj. The capacitance CERj is proportional to the combined electric charges Qj, and thus the following expression is established.

$$Pj \propto Qj \quad (14)$$

Moreover, detection data Si generated for the terminal Ti by the capacitance detection part 12 is proportional to the detected electric charges QDi inputted from the terminal Ti to the capacitance detection part 12, and thus the following expression is established.

$$Si \propto QDi \quad (15)$$

Furthermore, a certain relationship is established between the M pieces of element data P1 to PM and the N pieces of detection data S1 to SN. Specifically, the M pieces of element data P1 to PM are each preferably represented by the sum of partial element data U distributed to the respective N pieces of detection data S1 to SN at a predetermined proportion. The partial element data U distributed from the element data Pj to the detection data Si is denoted by "Uij". The element data Uij is proportional to the distribution electric charges QDij distributed from the overlapping portion of one electrode ER overlapping the segment Aj to the terminal Ti, and thus the following expression is established.

$$Uij \propto QDij \quad (16)$$

By applying Expression (14) and Expression (16) to Equation (13), the following equation is obtained.

$$P_j = \sum_{i=1}^{N} U_{ij} \qquad (17)$$

By applying Expression (15) and Expression (16) to Equation (10), the following equation is obtained.

$$S_i = \sum_{j=1}^{M} U_{ij} \qquad (18)$$

By applying Expression (14) and Expression (16) to Equation (9), the following equation is obtained.

$$K_{ij} = \frac{U_{ij}}{P_j} \qquad (19)$$

By applying Expression (14) and Expression (15) to Equation (11), the following equation is established.

$$S_i = \sum_{j=1}^{M} K_{ij} P_j \qquad (20)$$

FIG. 5 illustrates the relationship between the N pieces of detection data S1 to SN and the M pieces of element data P1 to PM and represents the relationship of Equations (17) and (18). As seen from FIG. 3, the detection data Si is approximate to the sum of partial element data Ui1 to UiM distributed from the N pieces of detection data S1 to SN, respectively. Thus, if it is possible to calculate the partial element data Ui1 to UiM from the element data P1 to PM, it is also possible to calculate the detection data Si by Equation (18).

FIG. 6 is a diagram for describing transformation from the M pieces of element data P1 to PM to the N pieces of detection data S1 to SN. Transformation, from the element data P1 to PM to the detection data S1 to SN, represented by Equation (20) is defined by N×M pieces of constant data Kij. As also seen from FIG. 6, this transformation is represented by the following equation using a matrix.

$$\underbrace{\begin{bmatrix} K_{11} & K_{12} & \cdots & K_{1M} \\ K_{21} & & & K_{2M} \\ \vdots & & & \vdots \\ K_{N1} & K_{N2} & \cdots & K_{NM} \end{bmatrix}}_{K} \begin{bmatrix} P_1 \\ P_2 \\ \vdots \\ P_M \end{bmatrix} = \begin{bmatrix} S_1 \\ S_2 \\ \vdots \\ S_N \end{bmatrix} \qquad (21)$$

The N×M matrix (first transformation matrix K) on the left side of Equation (21) is known data determined by the configuration of the sensor unit 10 such as the proportion of the area of the overlapping portion of each electrode ER on each segment A of the sensor unit 10 and the conductance from the overlapping portion of each electrode ER on each segment A to each terminal T.

Processing Unit 20

The processing unit 20 is a circuit that controls entire operation of the input device. For example, the processing unit 20 includes a computer that performs processing according to a command code of a program 31 stored in the storage unit 30, and dedicated hardware (logic circuit or the like) that realizes a specific function. The processing of the processing unit 20 may be entirely realized by the computer on the basis of a program, or may be partially or entirely realized by the dedicated hardware.

In the example in FIG. 1, the processing unit 20 includes a control part 21, an element data configuration part 22, and a coordinate calculation part 23.

The control part 21 controls the timing of detection by the sensor unit 10. For example, the control part 21 controls each circuit within the sensor unit 10 such that selection of an electrode ER for which detection is performed, sampling of an analog signal obtained as a detection result, generation of detection data S by A/D conversion, etc., are performed at appropriate timing.

The element data configuration part 22 performs processing of configuring M pieces of element data P1 to PM corresponding to the M segments A on the basis of N pieces of detection data generated in the sensor unit 10.

The element data configuration part 22 performs data configuration processing a plurality of times in order to converge the M pieces of element data P1 to PM to a certain value by repeating next-described data configuration processing a plurality of times. Then, the element data configuration part 22 obtains assumed values PA1 to PAM of M pieces of element data obtained by the plurality of times of the data configuration processing, as determined values of the M pieces of element data P1 to PM. In the following description, the assumed values PA1 to PAM of the M pieces of element data are sometimes described as "assumed values PA" without being distinguished from each other.

First, the data configuration processing will be described. Preferably, in one time of the data configuration processing, the element data configuration part 22 calculates assumed values SA1 to SAN of N pieces of detection data as the sum of the partial element data Uij distributed at a predetermined proportion (constant data Kij) from each of the assumed values PA1 to PAM of the M pieces of element data. Then, the element data configuration part 22 corrects the assumed values PA1 to PAM of the M pieces of element data on the basis of the N×M pieces of constant data Kij such that the calculated assumed values SA1 to SAN of the N pieces of detection data approach the N pieces of detection data S1 to SN which are the detection results of the sensor unit 10.

Specifically, the data configuration processing preferably includes four processes (first to fourth processes).

First Process

In the first process, the element data configuration part 22 transforms the assumed values PA1 to PAM of the M pieces of element data to the assumed values SA1 to SAN of the N pieces of detection data on the basis of the N×M pieces of constant data Kij which are known data. This transformation is represented by the following equation using the first transformation matrix K on the basis of the relationship of Equation (21).

$$\underbrace{\begin{bmatrix} K_{11} & K_{12} & \cdots & K_{1M} \\ K_{21} & & & K_{2M} \\ \vdots & & & \vdots \\ K_{N1} & K_{n2} & \cdots & K_{NM} \end{bmatrix}}_{K} \begin{bmatrix} PA_1 \\ PA_2 \\ \vdots \\ PA_M \end{bmatrix} = \begin{bmatrix} SA_1 \\ SA_2 \\ \vdots \\ SA_N \end{bmatrix} \qquad (22)$$

FIG. 7 is a diagram for describing the transformation from the assumed values PA1 to PAM of the M pieces of element data to the assumed values SA1 to SAN of the N pieces of detection data. Since the first transformation matrix K is known data, when the assumed values PA1 to PAM of the M pieces of element data are given, it is possible to calculate the assumed values SA1 to SAN of the N pieces of detection data by Equation (22).

Second Process

In the second process, the element data configuration part 22 calculates N first coefficients α1 to αN indicating multiplication factors by which the assumed values SA1 to SAN of the N pieces of detection data are multiplied to cause the assumed values SA1 to SAN of the N pieces of detection data to be equal to the N pieces of detection data S1 to SN. The first coefficient αi is represented by the following equation.

$$\alpha_i = \frac{S_i}{SA_i} \quad (23)$$

The calculation of the first coefficients α1 to αN in the second process is represented using a matrix as follows.

$$\begin{bmatrix} \alpha_1 \\ \alpha_2 \\ \vdots \\ \alpha_N \end{bmatrix} = \begin{bmatrix} S_1/SA_1 \\ S_2/SA_2 \\ \vdots \\ S_n/SA_N \end{bmatrix} \quad (24)$$

Third Process

In the third process, the element data configuration part 22 calculates M second coefficients β1 to βM indicating multiplication factors by which the assumed values PA1 to PAM of the M pieces of element data are multiplied. Specifically, the element data configuration part 22 transforms the N first coefficients α1 to αN to the M second coefficients β1 to βM on the basis of the N×M pieces of constant data Kij.

As shown in Equation (19), the partial element data Uij distributed from the element data Pj to the detection data Si occupies a proportion corresponding to the constant data Kij in the entirety of the element data Pj. The larger the constant data Kij, the higher the correlation between the element data Pj and the detection data Si. Therefore, the correlation between the first coefficient αi and the second coefficient βj is also estimated to be higher as the constant data Kij becomes larger. Thus, when calculating the second coefficient βj, the element data configuration part 22 does not simply average the N first coefficients α1 to αN but averages the N first coefficients α1 to αN with the constant data Kij assigned as weights to the first coefficients α1 to αN, respectively. Specifically, the second coefficient βj is represented by the following equation.

$$\beta_j = \sum_{i=1}^{N} K_{ij}\alpha_i \quad (25)$$

Figure 8:
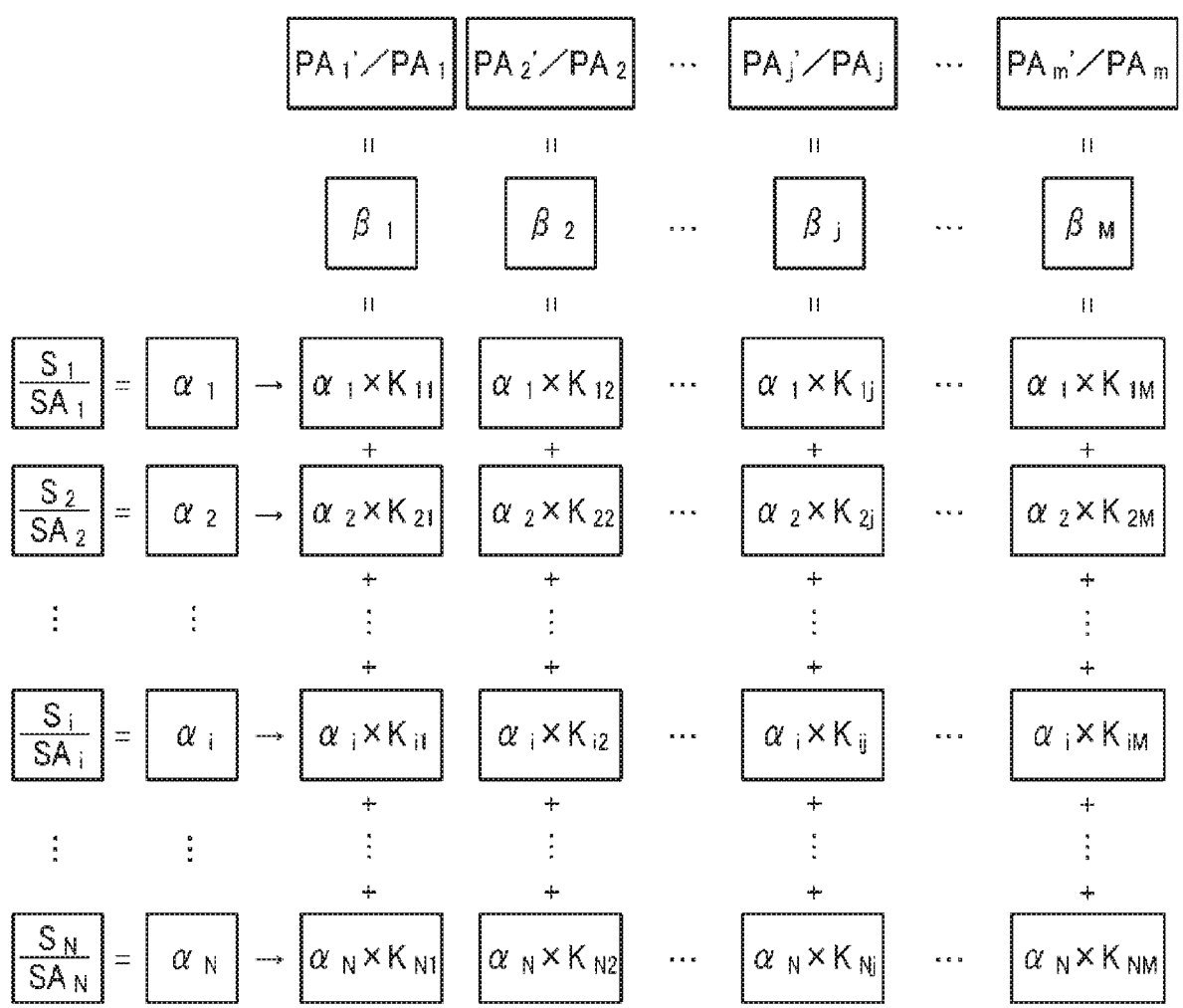
FIG. 8 is a diagram for describing transformation of N first coefficients to M second coefficients.

FIG. 8 is a diagram for describing the transformation from the N first coefficients α1 to αN to the M second coefficients β1 to βM. As also seen from this drawing, the relationship of Equation (25) is represented by the following equation using a matrix.

$$\underbrace{\begin{bmatrix} K_{11} & K_{21} & \cdots & K_{N1} \\ K_{12} & & & K_{N2} \\ \vdots & & & \vdots \\ K_{1M} & K_{2M} & \cdots & K_{NM} \end{bmatrix}}_{K^T} \begin{bmatrix} \alpha_1 \\ \alpha_2 \\ \vdots \\ \alpha_N \end{bmatrix} = \begin{bmatrix} \beta_1 \\ \beta_2 \\ \vdots \\ \beta_M \end{bmatrix} \quad (26)$$

The M×N matrix (second transformation matrix $K^T$) on the left side of Equation (26) is a transposed matrix of the first transformation matrix K.

Fourth Process

In the fourth process, the element data configuration part 22 corrects the current assumed values PA1 to PAM of the element data to new assumed value PA'1 to PA'M on the basis of the M second coefficients β1 to βM obtained in the third process.

$$PA'j = \beta j PAj \quad (27)$$

The calculation of the assumed value PA'1 to PA'M of the element data in the fourth process is represented by the following equation using a matrix.

$$\begin{bmatrix} PA'_1 \\ PA'_2 \\ \vdots \\ PA'_M \end{bmatrix} = \begin{bmatrix} \beta_1 PA_1 \\ \beta_2 PA_2 \\ \vdots \\ \beta_M PA_M \end{bmatrix} \quad (28)$$

The element data configuration part 22 repeats correction of the assumed values PA1 to PAM of the element data by repeating the above-described data configuration processing. For example, the element data configuration part 22 repeats the data configuration processing a predetermined number of times and obtains assumed values PA1 to PAM of the element data obtained as a result of the data configuration processing, as determined values of the M pieces of element data P1 to PM.

The foregoing is the description of the element data configuration part 22.

The coordinate calculation part 23 calculates the coordinates on the operation surface 11 that an object (such as a finger or a pen) approaches, on the basis of the element data P1 to PM configured by the element data configuration part 22. For example, the coordinate calculation part 23 binarizes the two-dimensional data represented by the element data P1 to PM, and identifies a region in which data indicating the approach of the object gathers, as an individual object approach region. Then, the coordinate calculation part 23 creates profile data for each of the transverse direction and the longitudinal direction of the identified object approach region.

The transverse-direction profile data is obtained by calculating the sum of a group of element data Pj in the longitudinal direction of the operation surface 11 for each column, and arranging the sum of the element data Pj sequentially in the order in the transverse direction of the operation surface 11. The longitudinal-direction profile data is obtained by calculating the sum of a group of element data Pj in the transverse direction of the operation surface 11 for each row, and arranging the sum of the element data Pj sequentially in the order in the longitudinal direction of the operation surface 11. The coordinate calculation part 23 calculates the position of a peak and the position of a barycenter of the element data Pj for each of the transverse-direction profile data and the longitudinal-direction profile data. The position in the transverse direction and the position in the longitudinal direction obtained by this calculation represent the coordinates that the object approaches on the operation surface 11. The coordinate calculation part 23 stores data of the coordinates obtained by such calculation in a predetermined storage area of the storage unit 30.

Storage Unit 30

The storage unit 30 stores constant data and variable data to be used in the processing in the processing unit 20. If the processing unit 20 includes a computer, the storage unit 30 may store the program 31 that is executed in the computer. The storage unit 30 is configured to include, for example, a volatile memory such as a DRAM or a SRAM, a non-volatile memory such as a flash memory, a hard disk, etc.

Interface Unit 40

The interface unit 40 is a circuit for exchanging data between the input device and another control device (for example, a control IC of an information apparatus in which the input device is installed). The processing unit 20 outputs information (coordinate information of an object, the number of objects, etc.) stored in the storage unit 30, to a control device (not shown) through the interface unit 40. Also, the interface unit 40 may acquire the program 31 that is executed in the computer of the processing unit 20, from a non-transitory storage medium such as an optical disc or a USB memory, or a server on a network, and load the program 31 to the storage unit 30.

Figure 9:
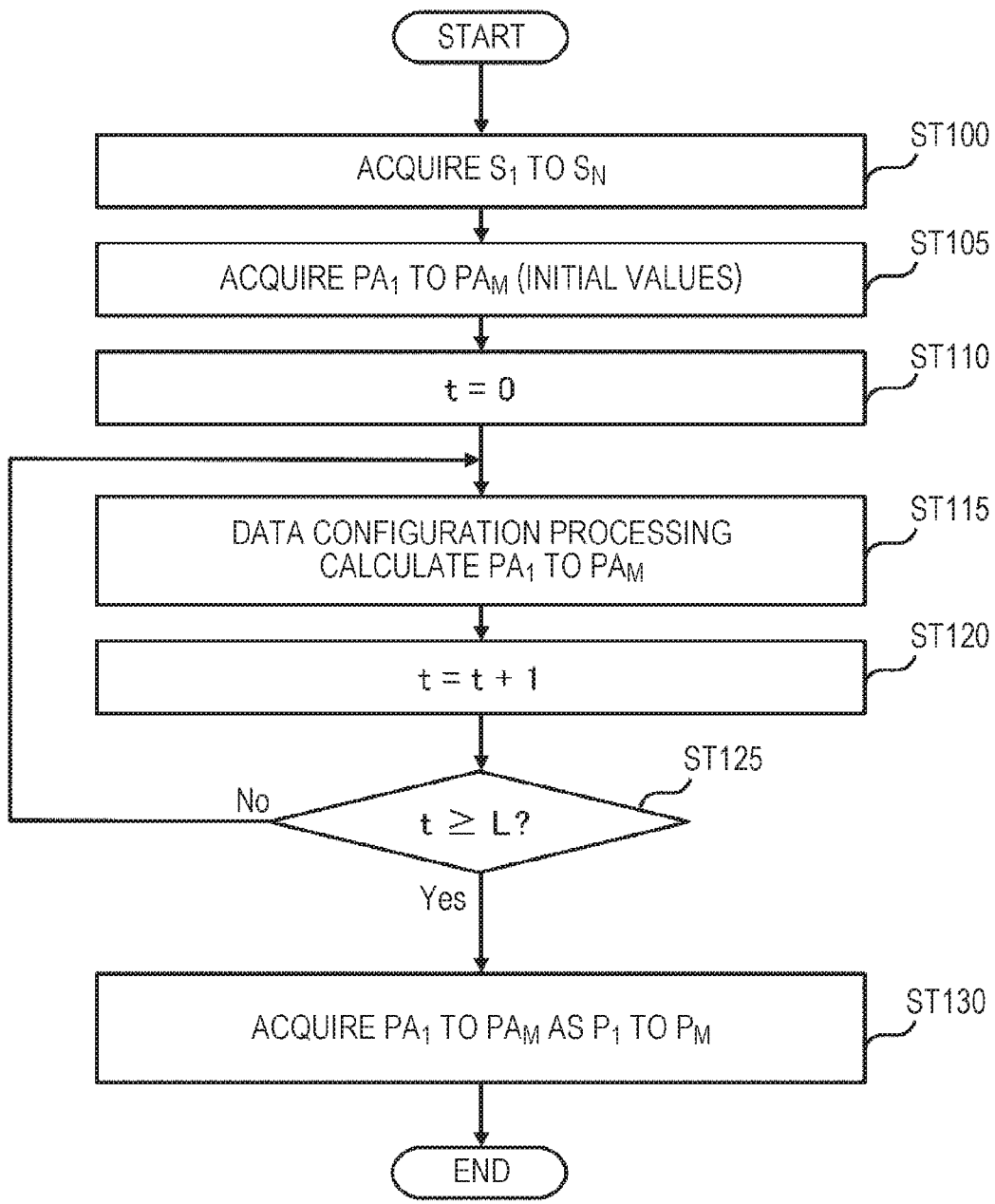
FIG. 9 is a flowchart for describing an example of a method for configuring M pieces of element data from N pieces of detection data in the input device according to the first embodiment.
Figure 10:
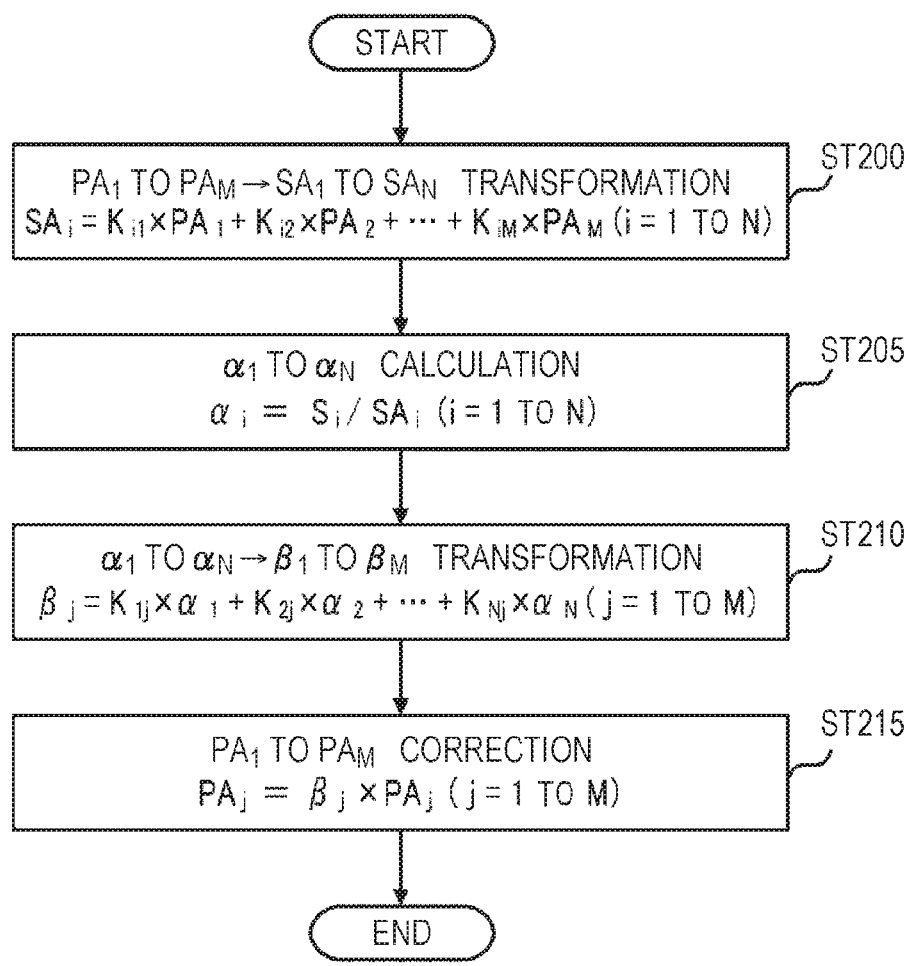
FIG. 10 is a flowchart for describing an example of data configuration processing.

The processing of configuring element data P in the input device according to the present embodiment will be described with reference to flowcharts in FIGS. 9 and 10.

ST100:

The processing unit 20 acquires N pieces of detection data S1 to SN generated in the sensor unit 10.

ST105:

The processing unit 20 acquires initial values of assumed values PA1 to PAM of element data to be used in later-described data configuration processing (ST115). The element data configuration part 22 acquires, for example, the constant data stored in the storage unit 30 in advance, as the initial values.

The element data configuration part 22 may acquire element data P1 to PM acquired as the configuration result (determined values) of the last time, as the initial values. Alternatively, on the basis of a plurality of sets of element data P1 to PM acquired as the configuration results (determined values) of a plurality of times until the last time, the element data configuration part 22 may calculate, for example, the moving average values of the respective element data, and acquire the moving average values as initial values for this time. By performing the data configuration processing (ST115) for the first time using the initial values based on one or more sets of element data P1 to PM configured immediately before, the accuracy of the configured element data improves as compared to the case where initial values having large errors from the element data are used.

ST110:

The processing unit 20 initializes a value of a variable t for counting the number of times the data configuration processing is repeated, to zero.

ST115:

The processing unit 20 performs the data configuration processing (FIG. 10) including the four processes (the first to fourth process).

First, in the first process (ST200), the processing unit 20 preferably calculates assumed values SA1 to SAN of N pieces of detection data by calculation of Equation (22) on the basis of assumed values PA1 to PAM of M pieces of element data and the first transformation matrix K.

Next, in the second process (ST205), the processing unit 20 calculates N first coefficients $\alpha1$ to $\alpha N$ by calculation of Equation (24) on the basis of the assumed values SA1 to SAN of the N pieces of detection data and the N pieces of detection data S1 to SN.

Next, in the third process (ST210), the processing unit 20 preferably calculates M second coefficients $\beta 1$ to $\beta M$ by calculation of Equation (26) on the basis of the N first coefficients $\alpha 1$ to $\alpha N$ and the second transformation matrix KT.

Next, in the fourth process (ST215), the processing unit 20 corrects the assumed values PA1 to PAM of the M pieces of element data by calculation of Equation (28) using the second coefficients $\beta 1$ to $\beta M$, respectively.

ST120, ST125:

The processing unit 20 increments the variable t (ST120). If the variable t after the increment does not reach "L", the processing unit 20 performs the data configuration processing in step ST115 again by using the assumed values PA1 to PAM of the element data after the correction. If the variable t after the increment reaches "L", the processing unit 20 proceeds to step ST130.

ST130:

The element data configuration part 22 acquires the assumed values PA1 to PAM of the element data obtained by L times of the data configuration processing, as determined values of the element data P1 to PM (ST130).

Figure 11A:
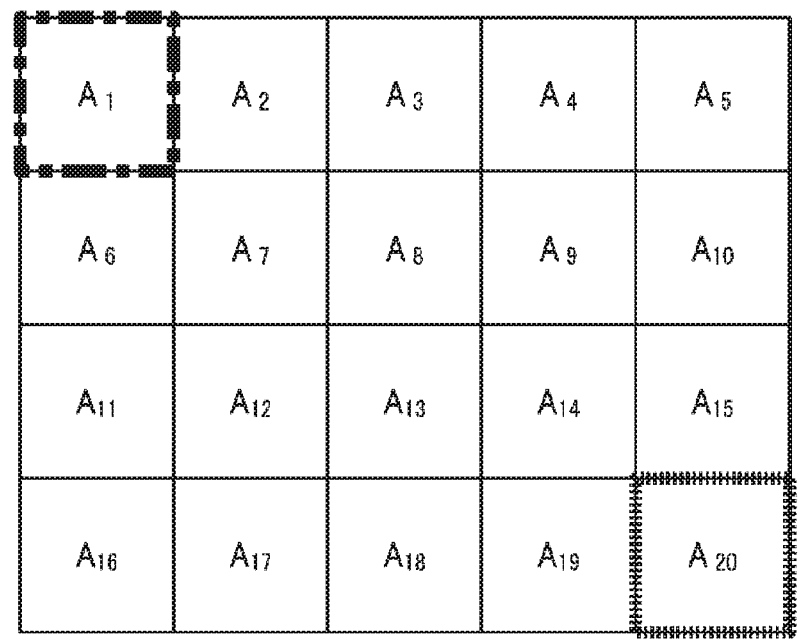
FIGS. 11A and 11B are diagrams showing an example of a pattern of electrodes in the input device according to the first embodiment, where
Figure 11B:
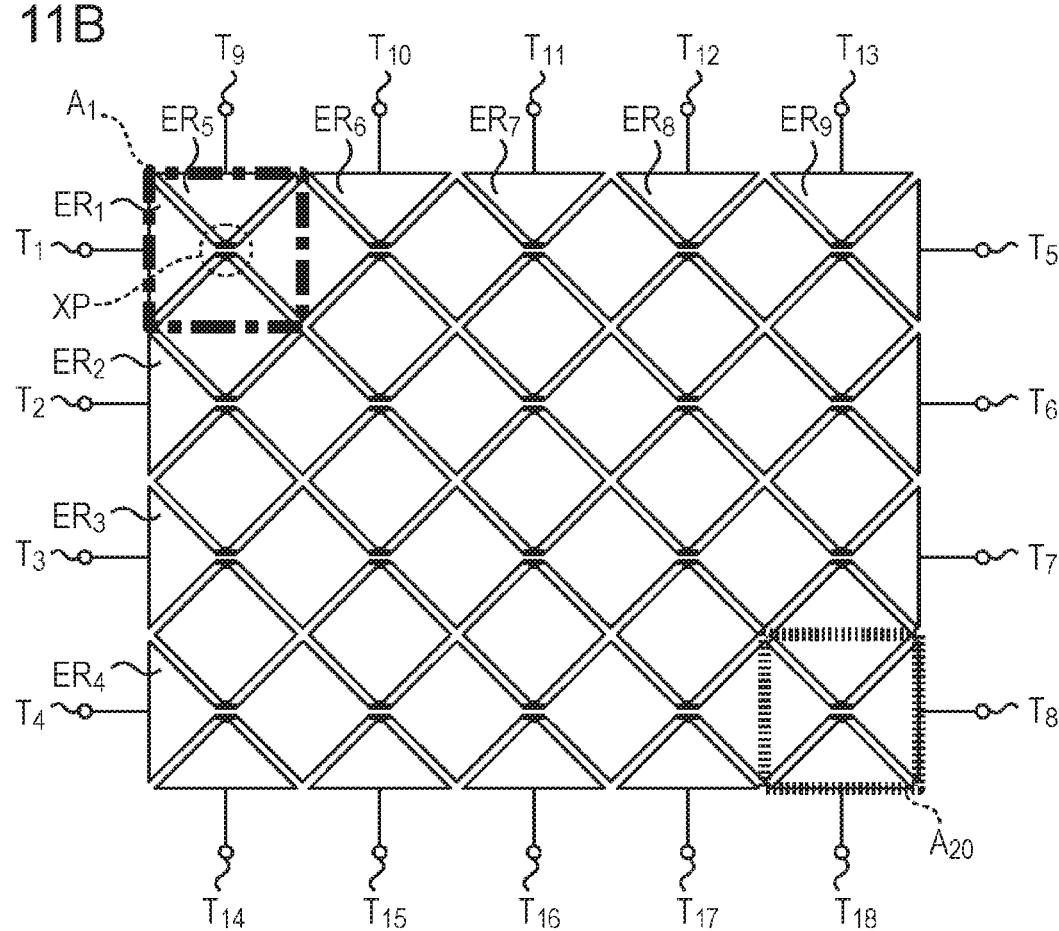
Figure 12A:
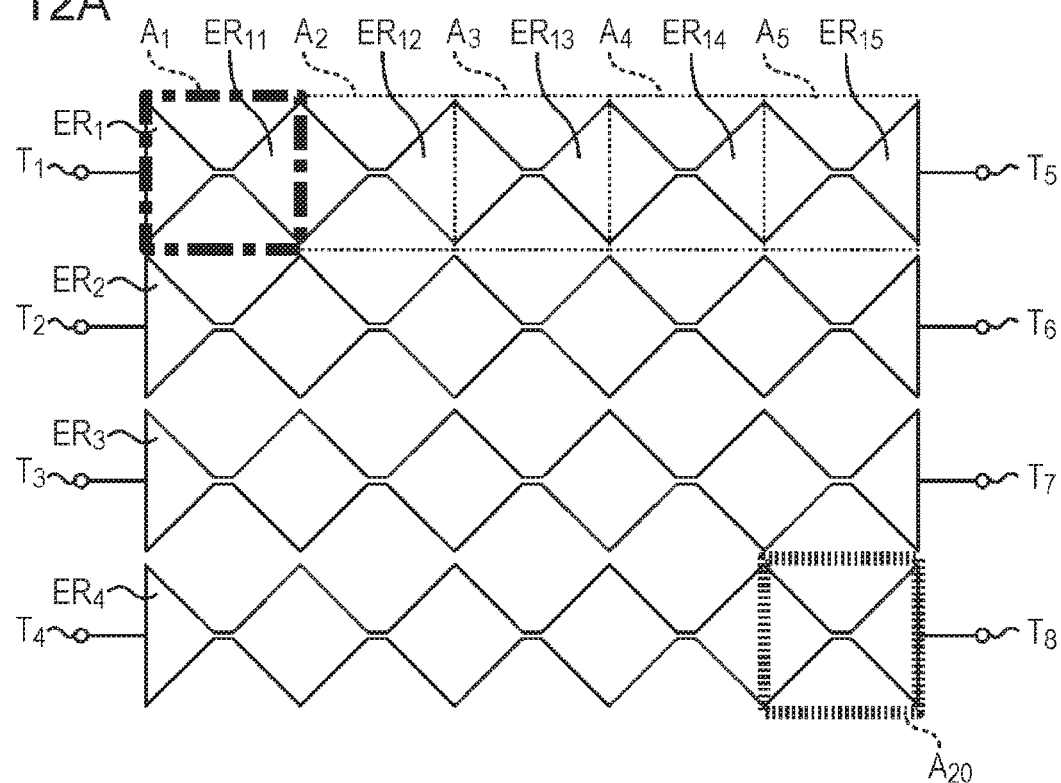
FIGS. 12A and 12B are diagrams showing the details of the pattern of the electrodes shown in FIG. 11B, where
Figure 12B:
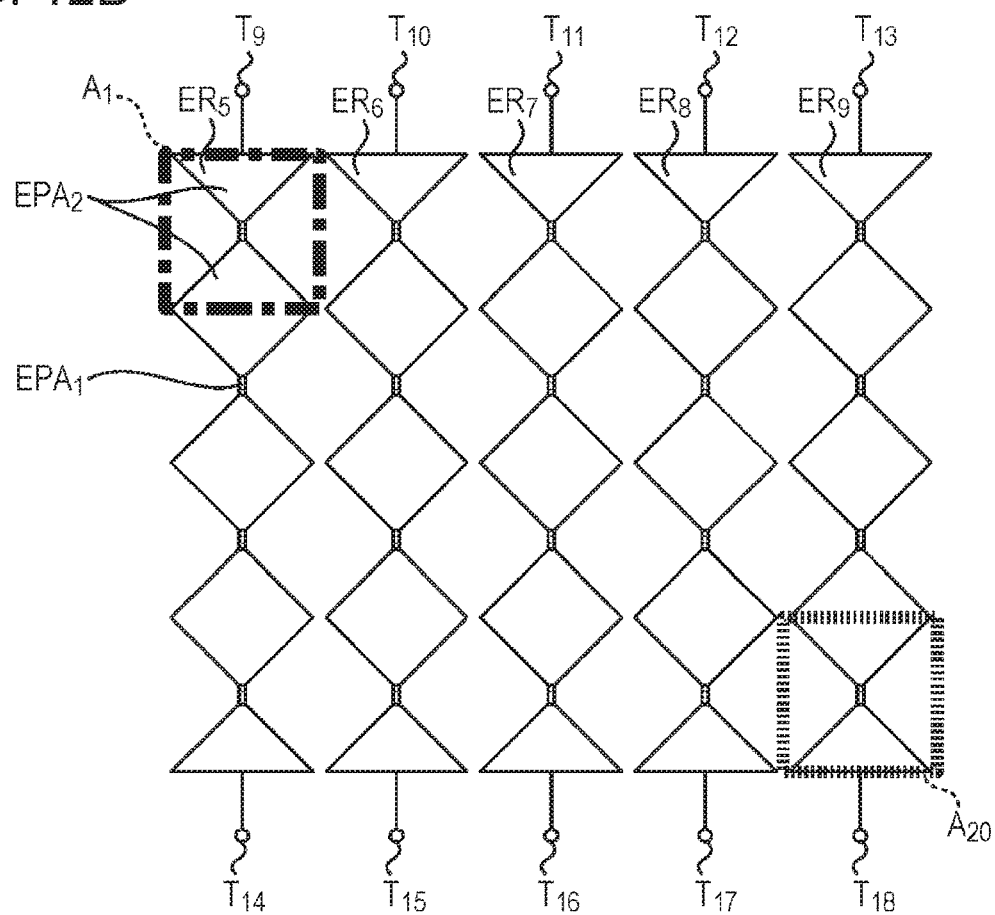
Figure 13A:
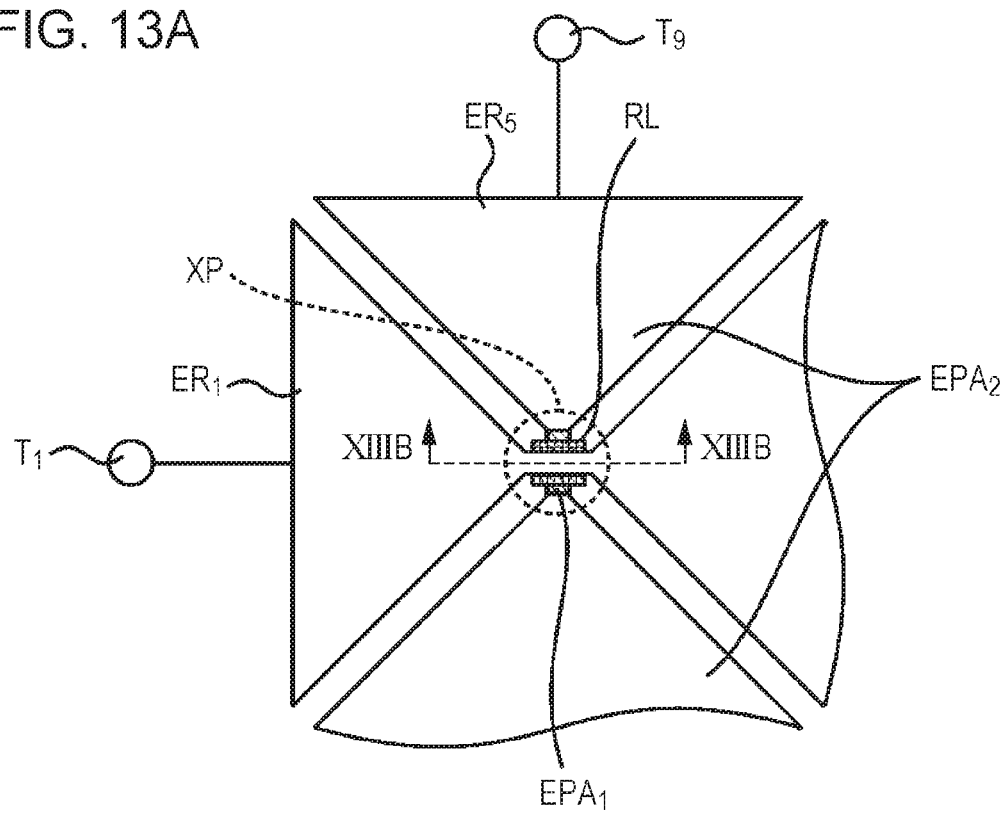
FIGS. 13A and 13B are enlarged views of an area around the intersection portion in the electrode pattern shown in FIG. 11B, where
Figure 13B:
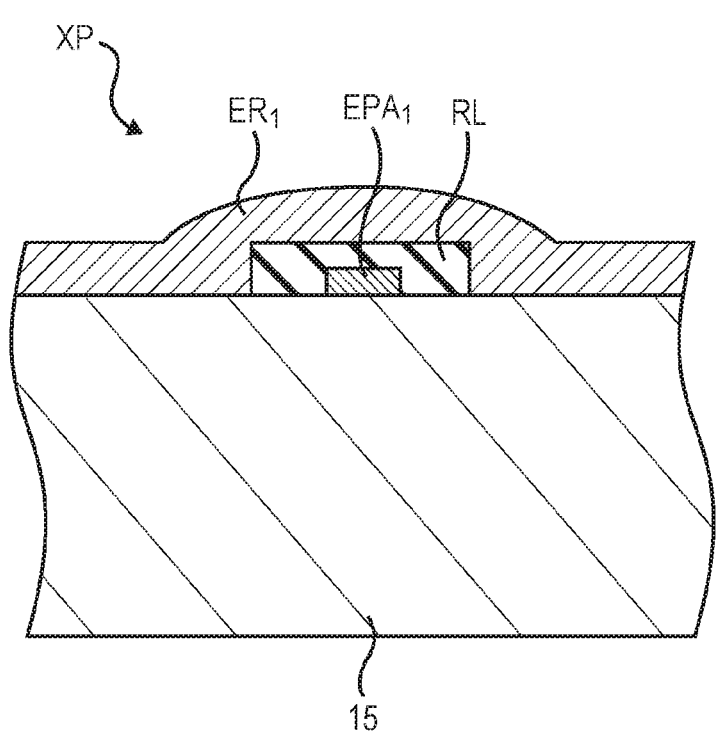

Next, an example of the pattern of the electrodes in the input device according to the present embodiment will be described. FIGS. 11A and 11B are diagrams showing an example of the pattern of the electrodes in the input device according to the first embodiment. FIG. 11A shows 20 segments (A1 to A20) of the operation surface 11, and FIG. 11B shows a pattern of nine electrodes (ER1 to ER9) overlapping the respective segments A. FIGS. 12A and 12B are diagrams showing the details of the pattern of the electrodes (ER1 to ER9) shown in FIG. 11B. FIG. 12A shows a pattern of four electrodes (ER1 to ER4) passing through the upper side of intersection portions XP, and FIG. 12B shows a pattern of five electrodes (ER5 to ER9) passing through the lower side of the intersection portions XP. FIGS. 13A and 13B are enlarged views of an area around the intersection portion XP of the electrode pattern shown in FIG. 11B. FIG. 13A is a plan view, and FIG. 13B is a cross-sectional view taken along a line XIIIB-XIIIB In this example, the electrodes ER1 to ER4 and the electrodes ER5 to ER9 are provided on a substrate 15. The substrate 15 is, for example, a printed board. Some electrodes of the electrodes ER1 to ER9 include a conductor pattern having high conductivity such as copper foil on the printed board.

In the example in FIG. 11, the operation surface 11 of the sensor unit 10 is substantially rectangular, and the 20 segments A1 to A20 each preferably having a rectangular shape are arranged in a matrix of 4 rows and 5 columns. The segments A1 to A5 are aligned in numerical order from the first column to the fifth column in the first row, the segments A6 to A10 are aligned in numerical order from the first column to the fifth column in the second row, the segments A11 to A15 are aligned in numerical order from the first column to the fifth column in the third row, and the segments A16 to A20 are aligned in numerical order from the first column to the fifth column in the fourth row.

In the example in FIG. 12A, the electrodes ER1 to ER4 are located in this order on the first row to the fourth row in the matrix arrangement of the segments A, and each extend from the first column to the fifth column in the row direction (the horizontal direction in the shown example). In this example, the electrodes ER1 to ER4 are also referred to as row-direction electrodes. The area proportions of the electrodes ER1 to ER4 in the respective segments are all ½. The electrodes ER1 to ER4 have terminals T1 to T4 at the ends thereof on the first column side, and have terminals T5 to T8 at the ends thereof on the fifth column side.

In one segment A, each of the electrodes ER1 to ER4 has a butterfly shape. That is, each of the electrodes ER1 to ER4 has a narrow width in the column direction (the vertical direction in the shown example) substantially at the center of the segment A, and the width thereof in the column direction continuously increases in the row direction from the center of the segment A.

In the example in FIG. 12B, the electrodes ER5 to ER9 are located in this order on the first column to the fifth column in the matrix arrangement of the segments A, and each extend from the first row to the fourth row in the column direction. In this example, the electrodes ER5 to ER9 are also referred to as column-direction electrodes. The area proportions of the electrodes ER5 to ER9 in the respective segments are all ½. The electrodes ER5 to ER9 have terminals T9 to T13 at the ends thereof on the first row side, and have terminals T14 to T18 at the ends thereof on the fourth row side.

In one segment A, each of the electrodes ER5 to ER9 has a butterfly shape. That is, each of the electrodes ER5 to ER9 has a narrow width in the row direction substantially at the center of the segment A, and the width thereof in the row direction continuously increases in the column direction from the center of the segment A.

The electrodes ER1 to ER4 and the electrodes ER5 to ER9 intersect each other at the narrow-width portions substantially at the centers of the segments A as shown in FIGS. 11B and 13A.

The electrodes ER5 to ER9 each preferably include first partial electrodes EPA1 each provided within one segment A, and second partial electrodes EPA2 each provided between two first partial electrodes EPA1 belonging to two adjacent segments A. As shown in FIG. 12B, each first partial electrode EPA1 is provided at the narrow-width portion at the center of the segment A. The second partial electrodes EPA2 include two triangular portions that sandwich the first partial electrode EPA1 at both sides in the column direction. The bases of the triangular portions are located at the edges in the column direction of the segment A.

The first partial electrodes EPA1 are formed from a material (first conductive material) having relatively high conductivity, and are, for example, metal foil such as copper. The second partial electrodes EPA2 are formed from a material (second conductive material) having relatively low conductivity, and are, for example, films formed by printing with conductive ink containing a conductive material such as carbon or PEDOT (conductive polymer) on the surface of the substrate 15.

The entireties of the electrodes ER1 to ER4 are formed from the second conductive material having relatively low conductivity (carbon printing or the like).

Insulating layers RL for electrically insulating the electrodes ER1 to ER4 and the electrodes ER5 to ER9 from each other are provided at the intersection portions XP of the electrodes ER1 to ER4 and the electrodes ER5 to ER9 as shown in FIG. 13B.

As an example, attention is focused on the terminal T1 of the electrode ER1. The terminal T1 is directly connected to an overlapping portion ER11 of the segment A1 and the electrode ER1. Thus, all of partial electric charges QP11 stored at the overlapping portion ER11 are approximated to be distributed to the terminal T1. In addition, the partial electric charges QP11 are ½ of combined electric charges Q1 on the basis of the area proportion of the overlapping portion ER11 in the segment A1. Therefore, constant data K11 of the electrode ER1 with respect to the segment A1 is ½.

An overlapping portion ER12 of the segment A2 and the electrode ER1 is connected to the terminal T1 across one segment and connected to the terminal T5 across three segments. Thus, ¾ of partial electric charges QP12 stored at the overlapping portion ER12 is approximated to be distributed to the terminal T1, and ¼ of the partial electric charges QP12 is approximated to be distributed to the terminal T5. In addition, the partial electric charges QP12 are ½ of combined electric charges Q2 on the basis of the area proportion of the overlapping portion ER12 in the segment A2. Therefore, constant data K12 of the electrode ER1 with respect to the segment A2 is ⅜.

An overlapping portion ER13 of the segment A3 and the electrode ER1 is connected to the terminal T1 across two segments and connected to the terminal T5 across two segments. Thus, ½ of partial electric charges QP13 stored at the overlapping portion ER13 is approximated to be distributed to the terminal T1, and ½ of the partial electric charges QP13 is approximated to be distributed to the terminal T5. In addition, the partial electric charges QP13 are ½ of combined electric charges Q3 on the basis of the area proportion of the overlapping portion ER13 in the segment A3. Therefore, constant data K13 of the electrode ER1 with respect to the segment A3 is ¼.

An overlapping portion ER14 of the segment A4 and the electrode ER1 is connected to the terminal T1 across three segments and connected to the terminal T5 across one segment. Thus, ¼ of partial electric charges QP14 stored at the overlapping portion ER14 is approximated to be distributed to the terminal T1, and ¾ of the partial electric charges QP14 is approximated to be distributed to the terminal T5. In addition, the partial electric charges QP14 are ½ of combined electric charges Q4 on the basis of the area proportion of the overlapping portion ER14 in the segment A4. Therefore, constant data K14 of the electrode ER1 with respect to the segment A4 is ⅛.

An overlapping portion ER15 of the segment A5 and the electrode ER1 is directly connected to the terminal T5. Thus, all of partial electric charges QP15 stored at the overlapping portion ER15 are approximated to be distributed to the terminal T5. Therefore, constant data K15 of the electrode ER1 with respect to the segment A5 is zero.

To summarize the above, the constant data K11, K12, K13, K14, and K15 are ½, ⅜, ¼, ⅛, and 0, respectively. By the same calculation, it is possible to obtain a first transformation matrix K including 18×20 constant data Kij. The first transformation matrix K is represented by the following expression.

$$K = \begin{bmatrix} 0.5 & 0.38 & 0.25 & 0.13 & 0 & 0 & 0 & 0 & 0 & 0 & 0 & 0 & 0 & 0 & 0 & 0 & 0 & 0 & 0 & 0 \\ 0 & 0 & 0 & 0 & 0 & 0.5 & 0.38 & 0.25 & 0.13 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0.5 & 0.38 & 0.25 & 0.13 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0.5 & 0.38 & 0.25 & 0.13 & 0 \\ 0 & 0.13 & 0.25 & 0.38 & 0.5 & 0 & 0 & 0 & 0 & 0 & 0 & 0 & 0 & 0 & 0 & 0 & 0 & 0 & 0 & 0 \\ 0 & 0 & 0 & 0 & 0 & 0 & 0.13 & 0.25 & 0.38 & 0.5 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0.13 & 0.25 & 0.38 & 0.5 & 0 & 0 & 0 & 0 & 0 \\ 0 & 0 & 0 & 0 & 0 & 0 & 0 & 0 & 0 & 0 & 0 & 0 & 0 & 0 & 0 & 0 & 0.13 & 0.25 & 0.38 & 0.5 \\ 0.5 & 0 & 0 & 0 & 0 & 0.33 & 0 & 0 & 0 & 0 & 0.17 & 0 & 0 & 0 & 0 & 0 & 0 & 0 & 0 & 0 \\ 0 & 0.5 & 0 & 0 & 0 & 0 & 0.33 & 0 & 0 & 0 & 0 & 0.17 & 0 & 0 & 0 & 0 & 0 & 0 & 0 & 0 \\ 0 & 0 & 0.5 & 0 & 0 & 0 & 0 & 0.33 & 0 & 0 & 0 & 0 & 0.17 & 0 & 0 & 0 & 0 & 0 & 0 & 0 \\ 0 & 0 & 0 & 0.5 & 0 & 0 & 0 & 0 & 0.33 & 0 & 0 & 0 & 0 & 0.17 & 0 & 0 & 0 & 0 & 0 & 0 \\ 0 & 0 & 0 & 0 & 0.5 & 0 & 0 & 0 & 0 & 0.33 & 0 & 0 & 0 & 0 & 0.17 & 0 & 0 & 0 & 0 & 0 \\ 0 & 0 & 0 & 0 & 0 & 0.17 & 0 & 0 & 0 & 0 & 0.33 & 0 & 0 & 0 & 0 & 0.5 & 0 & 0 & 0 & 0 \\ 0 & 0 & 0 & 0 & 0 & 0 & 0.17 & 0 & 0 & 0 & 0 & 0.33 & 0 & 0 & 0 & 0 & 0.5 & 0 & 0 & 0 \\ 0 & 0 & 0 & 0 & 0 & 0 & 0 & 0.17 & 0 & 0 & 0 & 0 & 0.33 & 0 & 0 & 0 & 0 & 0.5 & 0 & 0 \\ 0 & 0 & 0 & 0 & 0 & 0 & 0 & 0 & 0.17 & 0 & 0 & 0 & 0 & 0.33 & 0 & 0 & 0 & 0 & 0.5 & 0 \\ 0 & 0 & 0 & 0 & 0 & 0 & 0 & 0 & 0 & 0.17 & 0 & 0 & 0 & 0 & 0.33 & 0 & 0 & 0 & 0 & 0.5 \end{bmatrix} \quad (29)$$

As described above, in the input device according to the present embodiment, the plurality of terminals T are provided to one electrode ER, and the N terminals T are provided as a whole. In addition, each of the M segments A into which the operation surface 11 is virtually divided overlaps one or more electrodes ER. In the capacitance detection part 12, electric charges stored at one electrode ER are simultaneously inputted from the plurality of terminals T provided to the one electrode ER. As a result of the simultaneous input, the partial electric charges stored between an object and the overlapping portion of one electrode ER overlapping one segment A are distributed as distribution electric charges to each of the plurality of terminals T in accordance with the conductance from the overlapping portion to each of the plurality of terminals T. In the capacitance detection part 12, detection data S corresponding to the distribution electric charges is generated for each of the N terminals T. In the element data configuration part 22, M pieces of element data P indicating degrees of approach of the object at the respective M segments A are configured on the basis of the N pieces of detection data S. Therefore, even when each electrode ER has relatively high resistance, it is possible to accurately configure the element data P for each segment A.

In the input device according to the present embodiment, the plurality of terminals T are provided to one electrode ER, and detection data S is generated for each of the N terminals T. Thus, the number of the electrodes ER is smaller than the number of the detection data S. Accordingly, as compared to a method that requires electrodes ER the number of which is equal to the number of detection data S, the density of wiring of the electrodes is reduced, and thus it is possible to simplify the configuration.

In the input device according to the present embodiment, since the electrode is formed by combining first partial electrodes EPA1 formed from the first conductive material having relatively high conductivity and second partial electrodes EPA2 formed from the second conductive material having relatively low conductivity, even when the types of first conductive material and second conductive material to be used are limited, the electrodes ER having desired conductivity are easily formed.

In the input device according to the present embodiment, the first partial electrode EPA1 is provided within one segment A, and the second partial electrode EPA2 is provided between the two first partial electrodes EPA1 belonging to two adjacent segments A. Accordingly, the second partial electrode EPA2 having low conductivity is not isolated within the segment A, and the electrode ER is not divided within the segment A such that flow of electric charges is not blocked. Thus, variations in distribution electric charges corresponding to a position, within the segment A, close to an object are easily reduced.

In the input device according to the present embodiment, it is possible to form the first partial electrodes EPA1, which are located, at the intersection portions XP, closer to the substrate 15 and provided to the electrodes ER5 to ER9, on the surface of the substrate 15 from metal foil having high conductivity such as copper foil, and thus the thicknesses of the intersection portions XP are easily reduced.

In the input device according to the present embodiment, since the entireties of the electrodes ER1 to ER4 are formed from the second conductive material having low conductivity, the configuration is simplified, and the input device is easily produced.

Figure 14A:
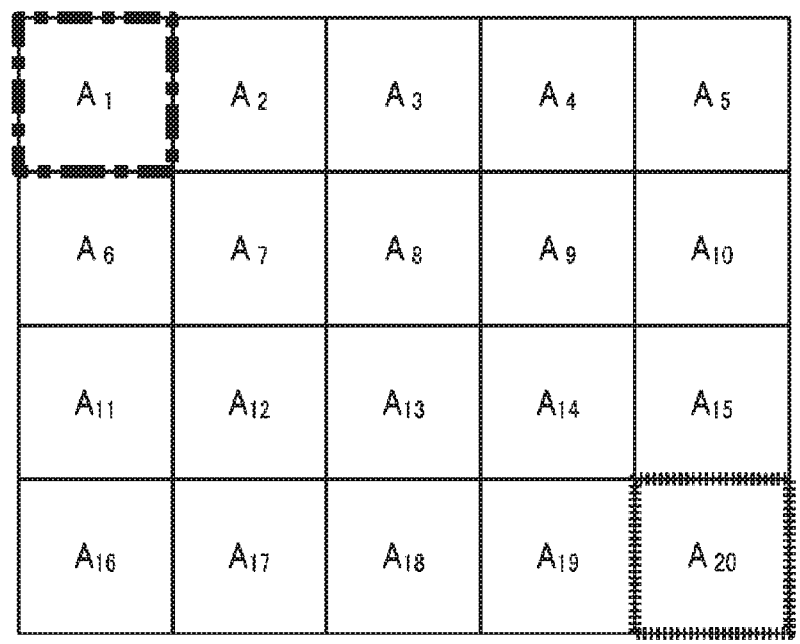
FIGS. 14A and 14B are diagrams showing a modification of the pattern of the electrodes in the input device according to the first embodiment, where
Figure 14B:
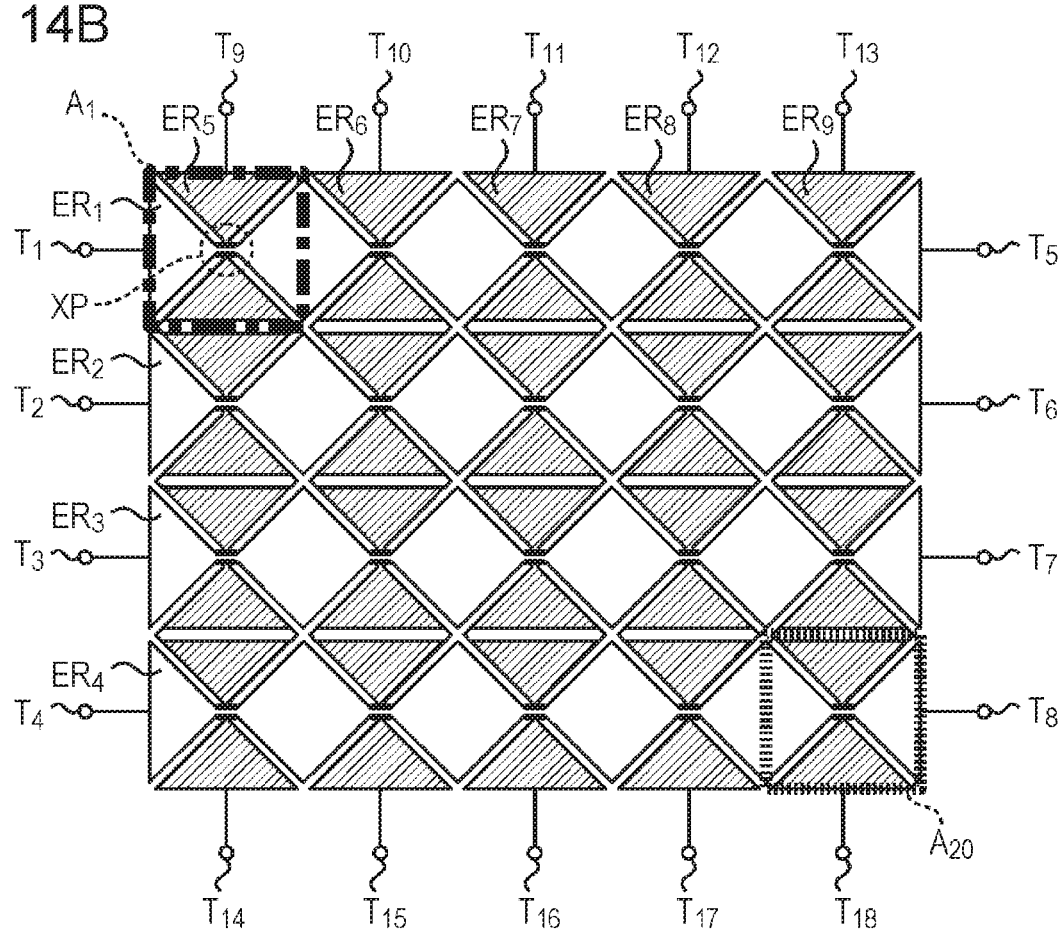
Figure 15A:
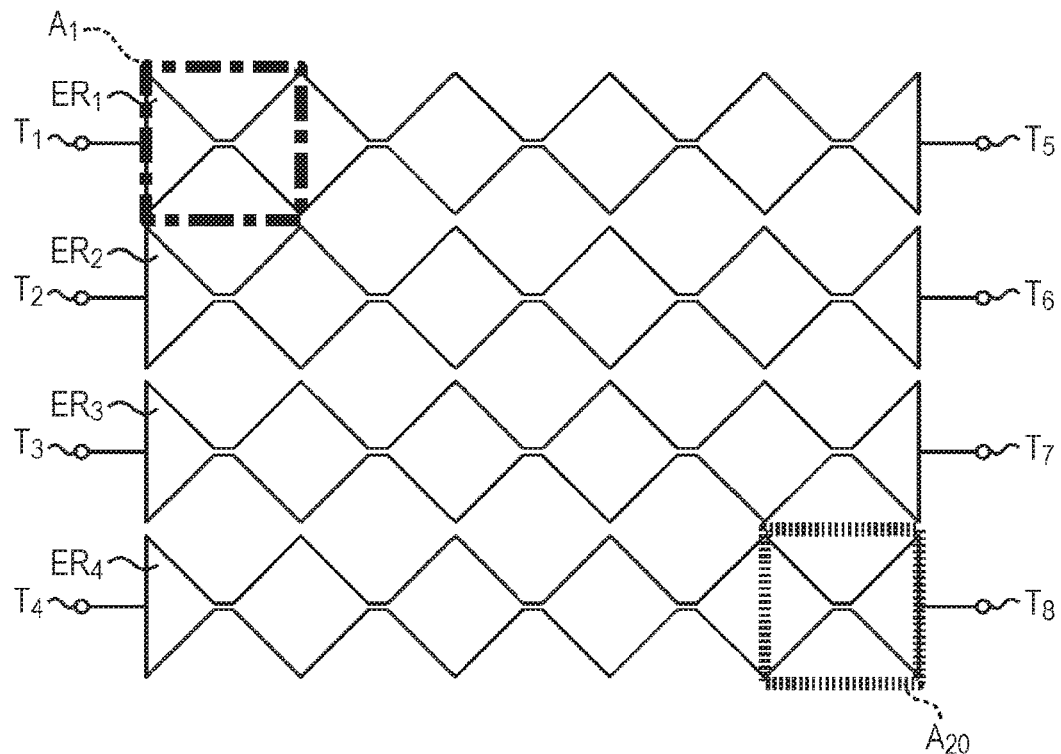
FIGS. 15A and 15B are diagrams showing the details of the pattern of the electrodes shown in FIG. 14B, where
Figure 15B:
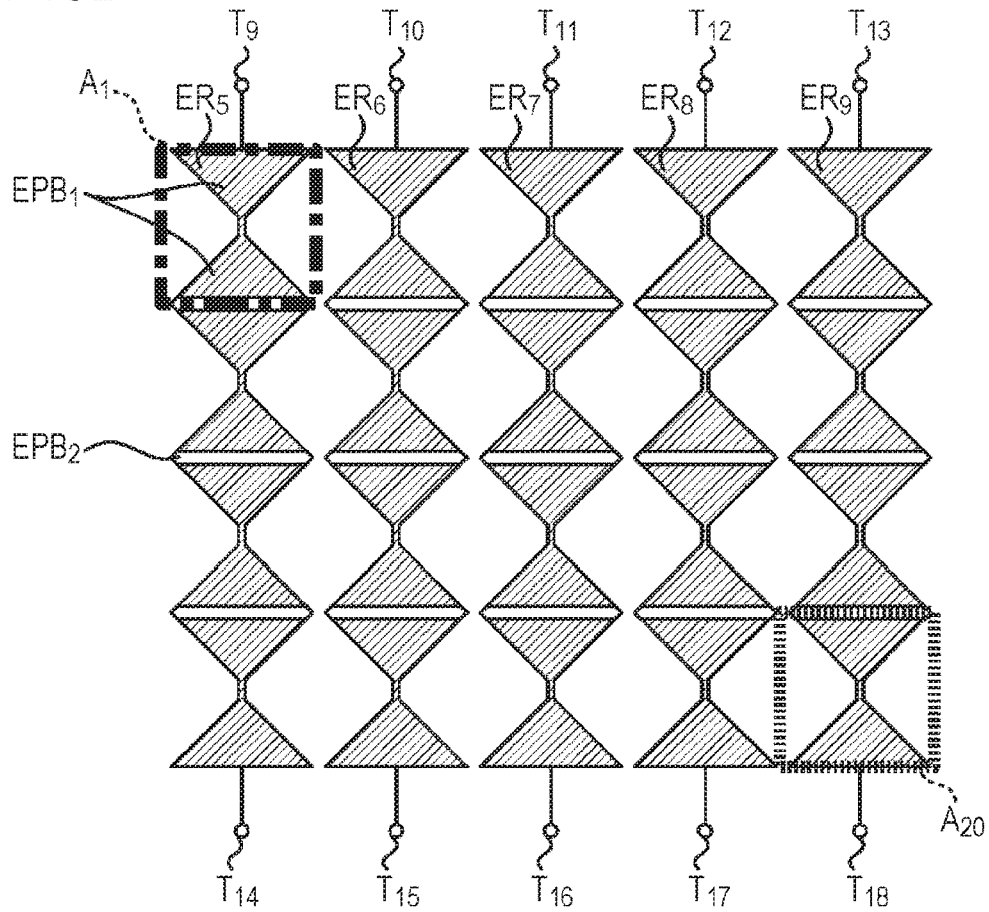

Next, one modification of the pattern of the electrodes in the input device according to the present embodiment will be described with reference to FIGS. 14A and 14B and FIGS. 15A and 15B. FIGS. 14A and 14B are diagrams showing the one modification of the pattern of the electrodes in the input device according to the first embodiment. FIG. 14A shows 20 segments (A1 to A20) of the operation surface 11, and FIG. 14B shows a pattern of electrodes (ER1 to ER9) overlapping the respective segments A. FIGS. 15A and 15B are diagrams showing the details of the pattern of the electrodes shown in FIG. 14B. FIG. 15A shows a pattern of four electrodes (ER1 to ER4) passing through the upper side of intersection portions XP, and FIG. 15B shows a pattern of five electrodes (ER5 to ER9) passing through the lower side of the intersection portions XP.

In this modification, the electrodes ER1 to ER4 in the row direction are the same as the electrodes with the same reference characters shown in FIG. 12A described above. On the other hand, the electrodes ER5 to ER9 in the column direction in this modification have the same outer shape as the electrodes with the same reference characters shown in FIG. 12B described above, but are different from the electrodes shown in FIG. 12B in shapes of first partial electrodes and second partial electrodes.

As shown in FIG. 15B, the electrodes ER5 to ER9 in the column direction in this modification each include first partial electrodes EPB1 formed from a first conductive material (copper foil or the like) having high conductivity, and second partial electrodes EPB2 formed from a second conductive material having low conductivity (carbon printing or the like). Each second partial electrode EPB2 is formed between two adjacent segments A so as to extend thinly in the row direction. Each first partial electrode EPB1 is generally formed so as to spread over the entire area of the segment A. Since each first partial electrode EPB1 is formed widely within the segment A, and each second partial electrode EPB2 is formed locally near the edge of the segment A as described above, variations in distribution electric charges corresponding to a position, within the segment A, close to an object are further easily reduced.

Second Embodiment

Next, a second embodiment of the present invention will be described. An input device according to the present embodiment is different from the input device according to the first embodiment in a pattern of electrodes ER in the sensor unit 10, but the other configuration thereof is generally the same as that of the input device according to the first embodiment. In the following, the differences will be mainly described.

Figure 16A:
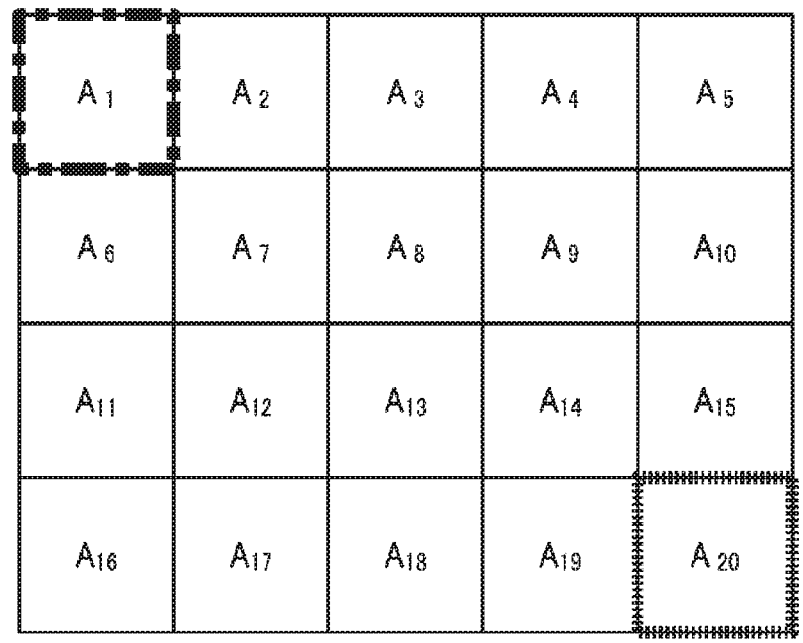
FIGS. 16A and 16B are diagrams showing an example of a pattern of electrodes in an input device according to a second embodiment, where
Figure 16B:
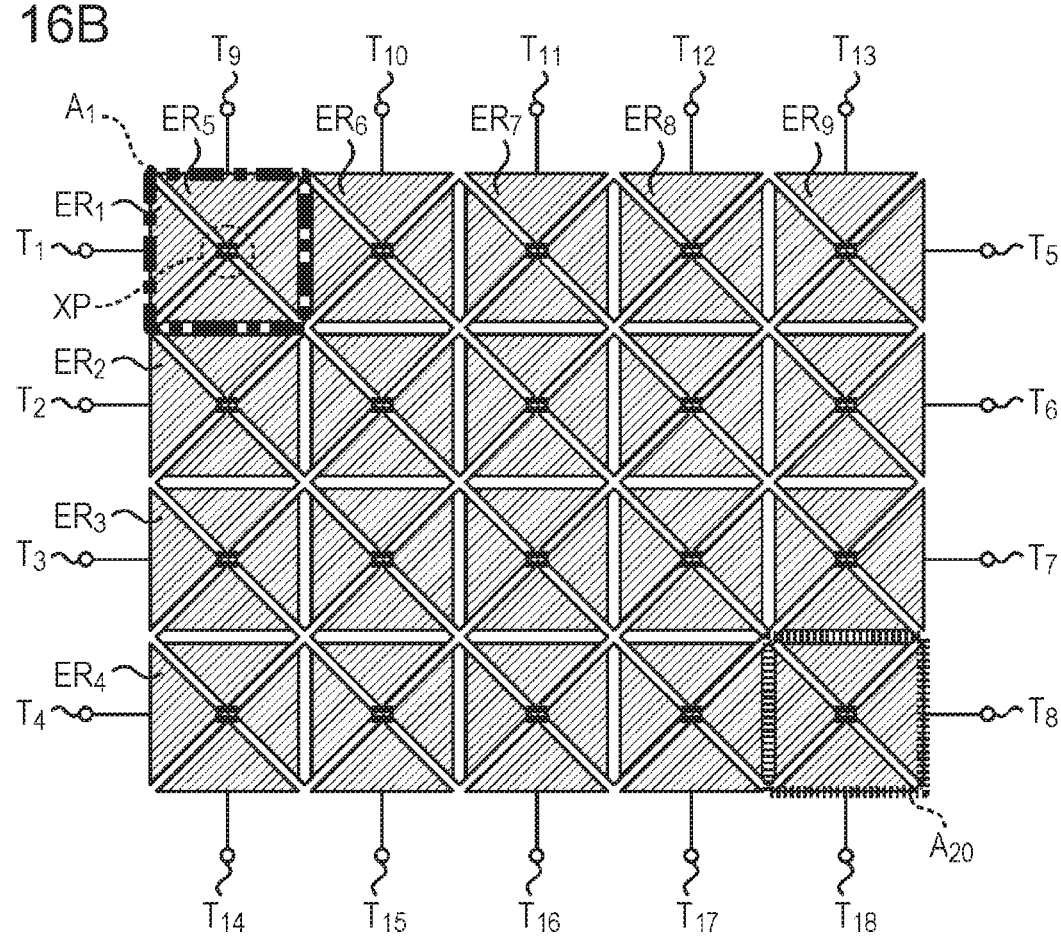
Figure 17A:
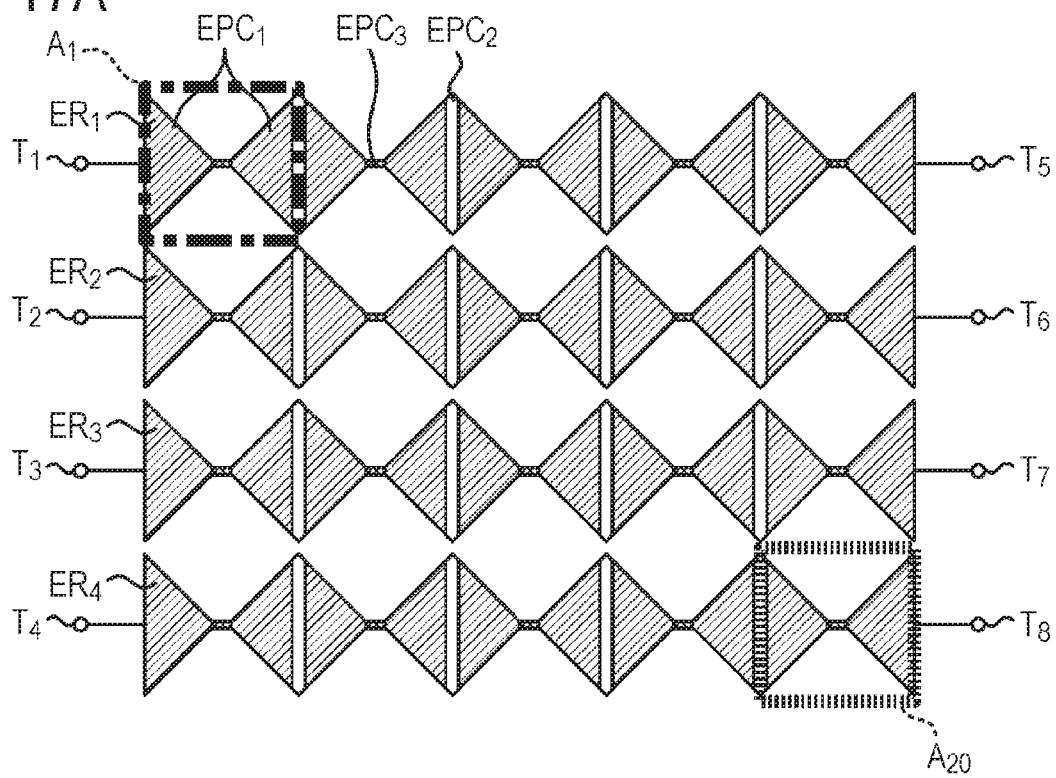
FIGS. 17A and 17B are diagrams showing the details of the pattern of the electrodes shown in FIG. 16B, where
Figure 17B:
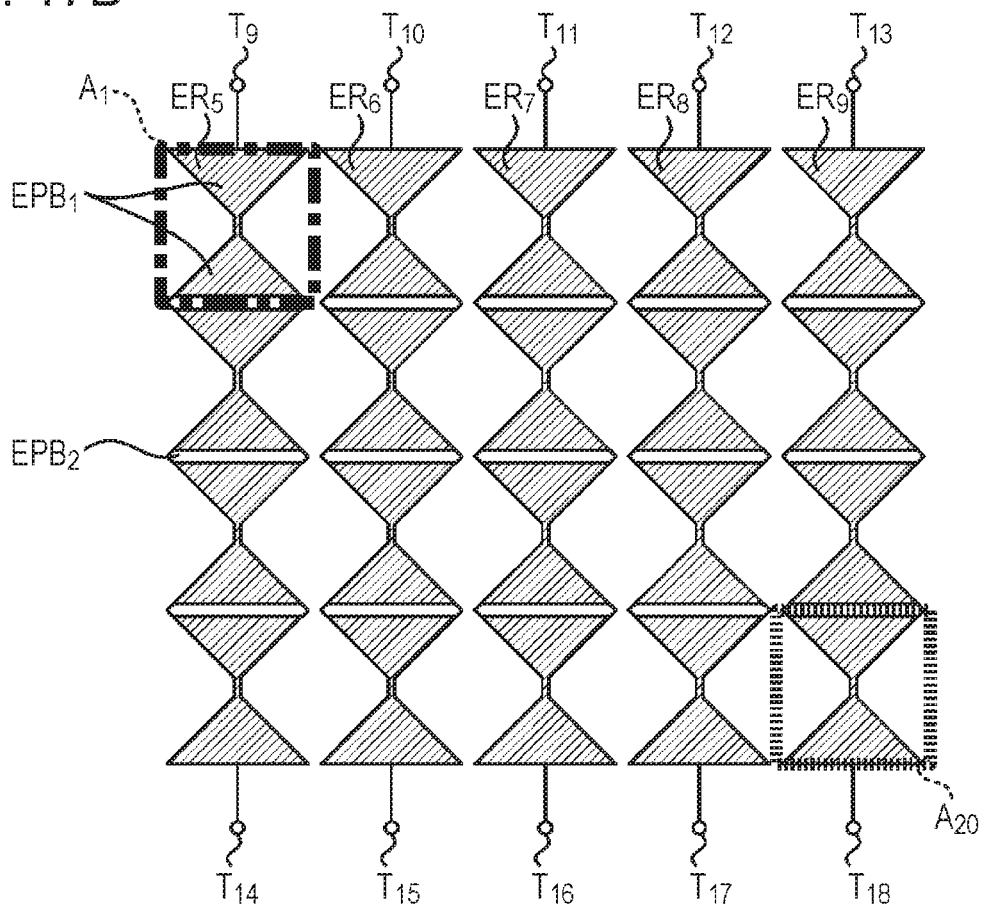
Figure 18A:
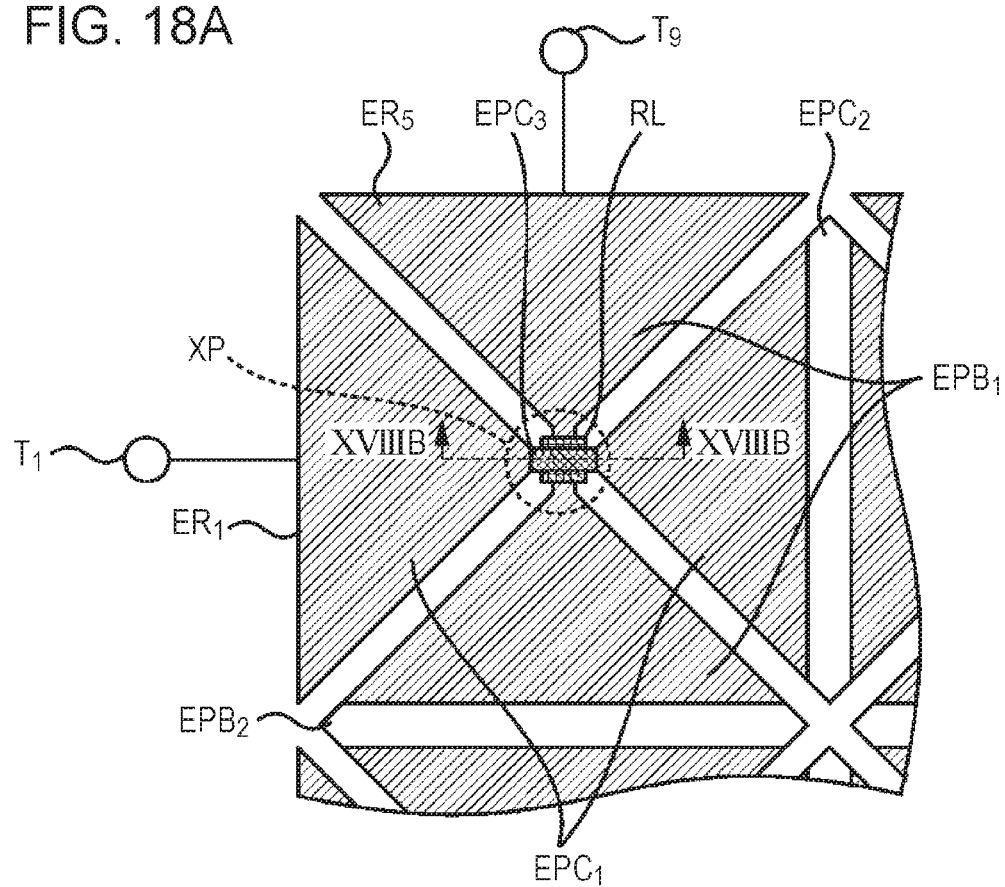
FIGS. 18A and 18B are enlarged views of an area around the intersection portion in the electrode pattern shown in FIG. 16B, where
Figure 18B:
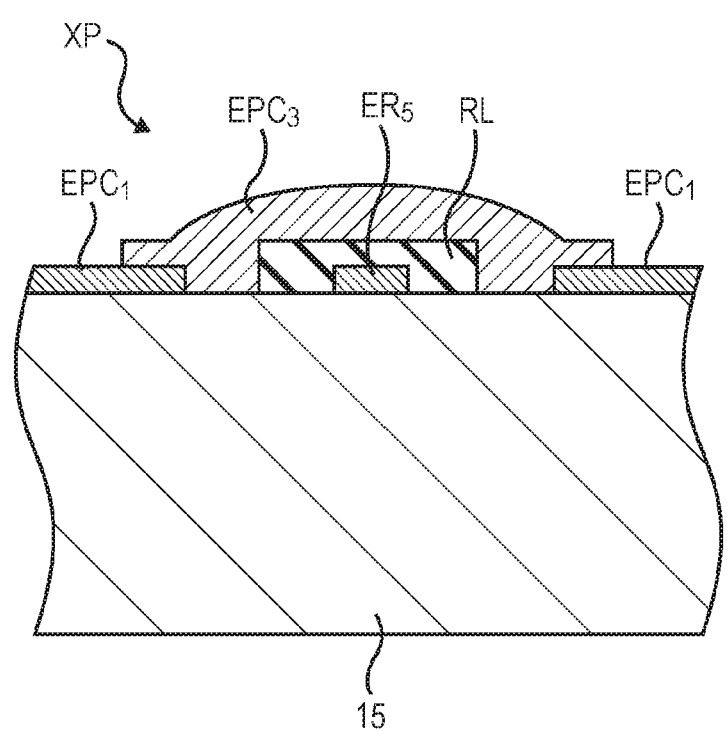

FIGS. 16A and 16B are diagrams showing an example of a pattern of electrodes in the input device according to the second embodiment. FIG. 16A shows 20 segments (A1 to A20) of an operation surface 11, and FIG. 16B shows a pattern of nine electrodes (ER1 to ER9) overlapping the respective segments A. FIGS. 17A and 17B are diagrams showing the details of the pattern of the electrodes (ER1 to ER9) shown in FIG. 16B. FIG. 17A shows a pattern of four electrodes (ER1 to ER4) passing through the upper portion of intersection portions XP, and FIG. 17B shows a pattern of five electrodes (ER5 to ER9) passing through the lower side of the intersection portions XP. FIGS. 18A and 18B are enlarged views of an area around the intersection portion XP in the electrode pattern shown in FIG. 16B. FIG. 18A is a plan view, and FIG. 18B is a cross-sectional view taken along a line XVIIIB-XVIIIB.

The outer shapes of the electrodes ER1 to ER9 in the present embodiment are the same as those of the electrodes ER1 to ER9 shown in FIGS. 15A and 15B described above. In particular, the electrodes ER5 to ER9 in the column direction in the present embodiment are the same as the electrodes ER5 to ER9 shown in FIG. 15B. The electrodes ER1 to ER4 in the row direction in the present embodiment are different from the electrodes ER1 to ER4 shown in FIG. 15A, in including first partial electrodes EPC1, second partial electrodes EPC2, and third partial electrodes EPC3.

As shown in FIG. 17A, the electrodes ER1 to ER4 in the row direction in the present embodiment each include first partial electrodes EPC1 formed from a first conductive material (copper foil or the like) having high conductivity, second partial electrodes EPC2 formed from a second conductive material having low conductivity (carbon printing or the like), and third partial electrodes EPC3 formed from a third conductive material having higher conductivity than the second conductive material. The third conductive material may be, for example, a type of conductive ink different from the second conductive material, or may be the same as the first conductive material.

Each third partial electrode EPC3 is a narrow portion at the center of the segment A, and is provided at a portion where an intersection portion XP with the column-direction electrode (ER5 to ER9) is formed. Each first partial electrode EPC1 includes two triangular portions that sandwich the third partial electrode EPC3 at both sides in the row direction, and the bases of the triangular portions are located near the edges in the row direction of the segment A. Each second partial electrode EPB2 is formed between two adjacent segments A so as to extend thinly in the column direction.

In the input device according to the present embodiment, since the first partial electrodes and the second partial electrodes are provided to both the column-direction electrodes and the row-direction electrodes, electrodes ER having desired conductivity are easily formed in each of the column-direction electrodes and the row-direction electrodes.

Moreover, since the third partial electrode EPC3 formed from the third conductive material having higher conductivity than the second conductive material is formed at the intersection portion XP formed within each segment A, it is possible to prevent the electrode ER from being divided by a partial electrode having low conductivity, within each segment A. Accordingly, variations in distribution electric charges corresponding to a position, within the segment A, close to an object are easily reduced.

Third Embodiment

Next, a third embodiment of the present invention will be described. An input device according to the present embodiment is different from the input device according to the first embodiment in a pattern of electrodes ER in the sensor unit 10, but the other configuration thereof is generally the same as that of the input device according to the first embodiment. In the following, the differences will be mainly described.

Figure 19A:
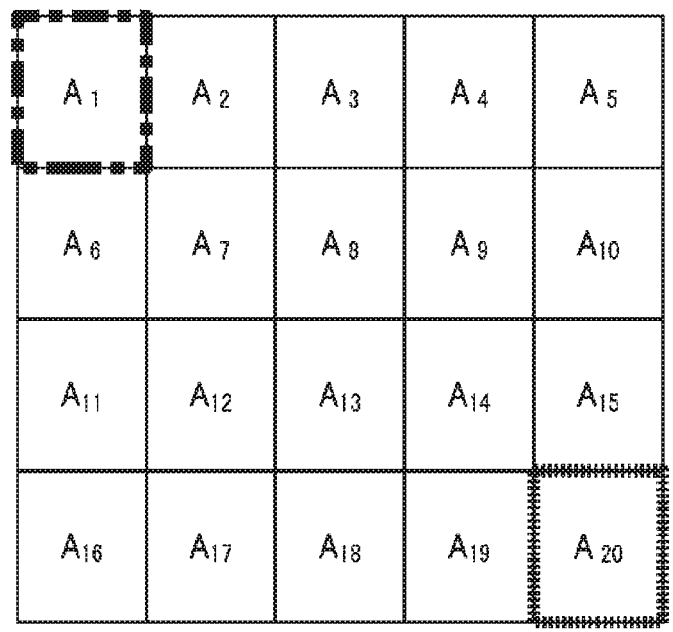
FIGS. 19A and 19B are diagrams showing an example of a pattern of electrodes in an input device according to a third embodiment, where
Figure 19B:
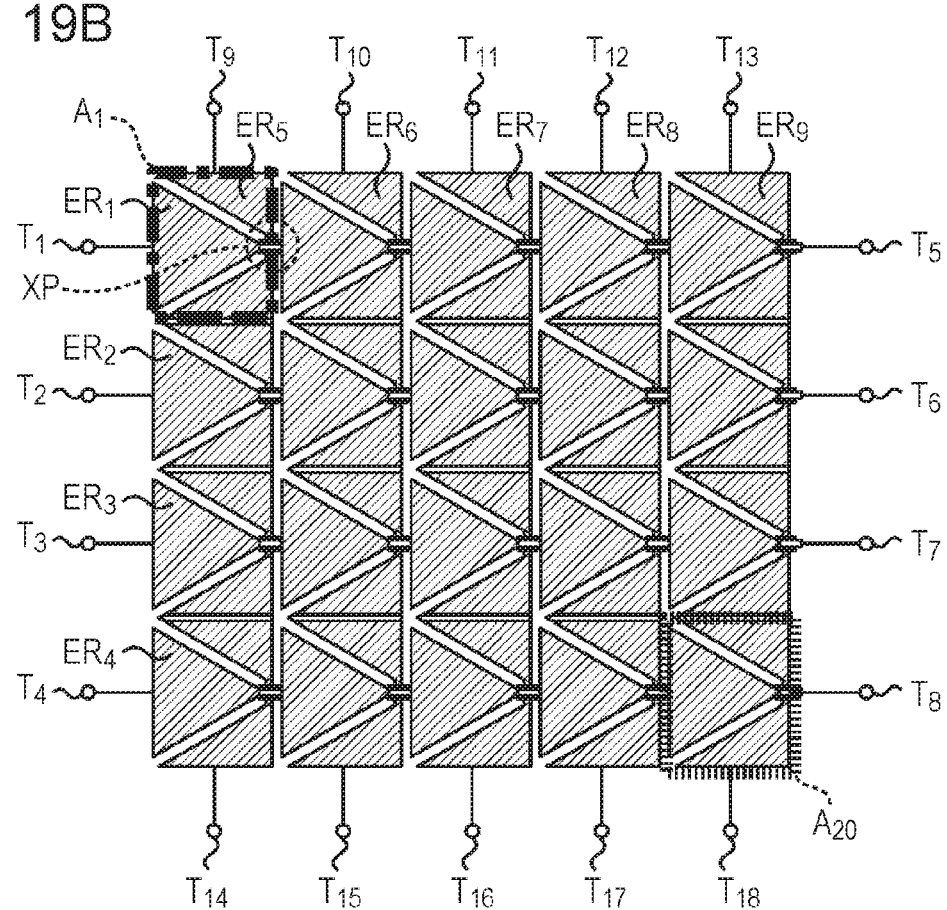
Figure 20A:
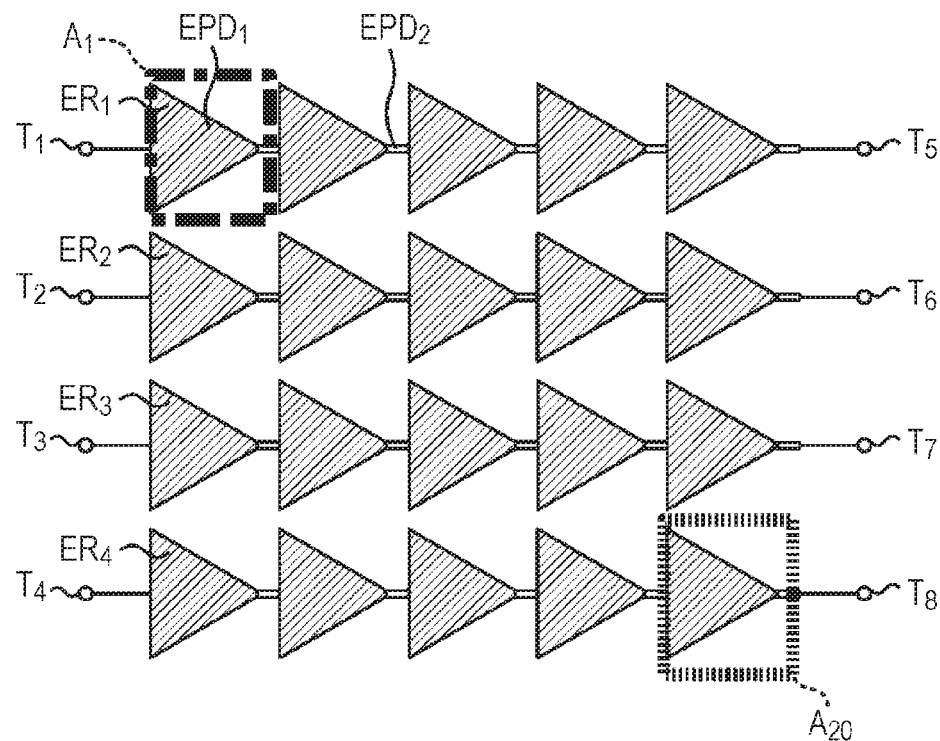
FIGS. 20A and 20B are diagrams showing the details of the pattern of the electrodes shown in FIG. 19B, where
Figure 20B:
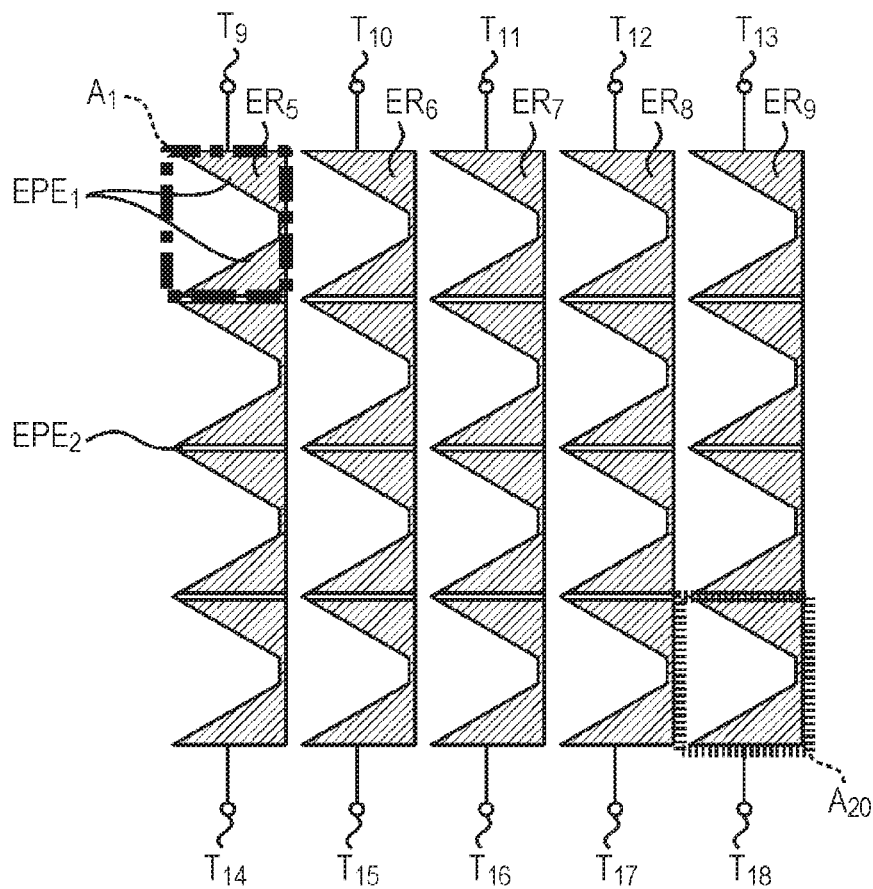
Figure 21A:
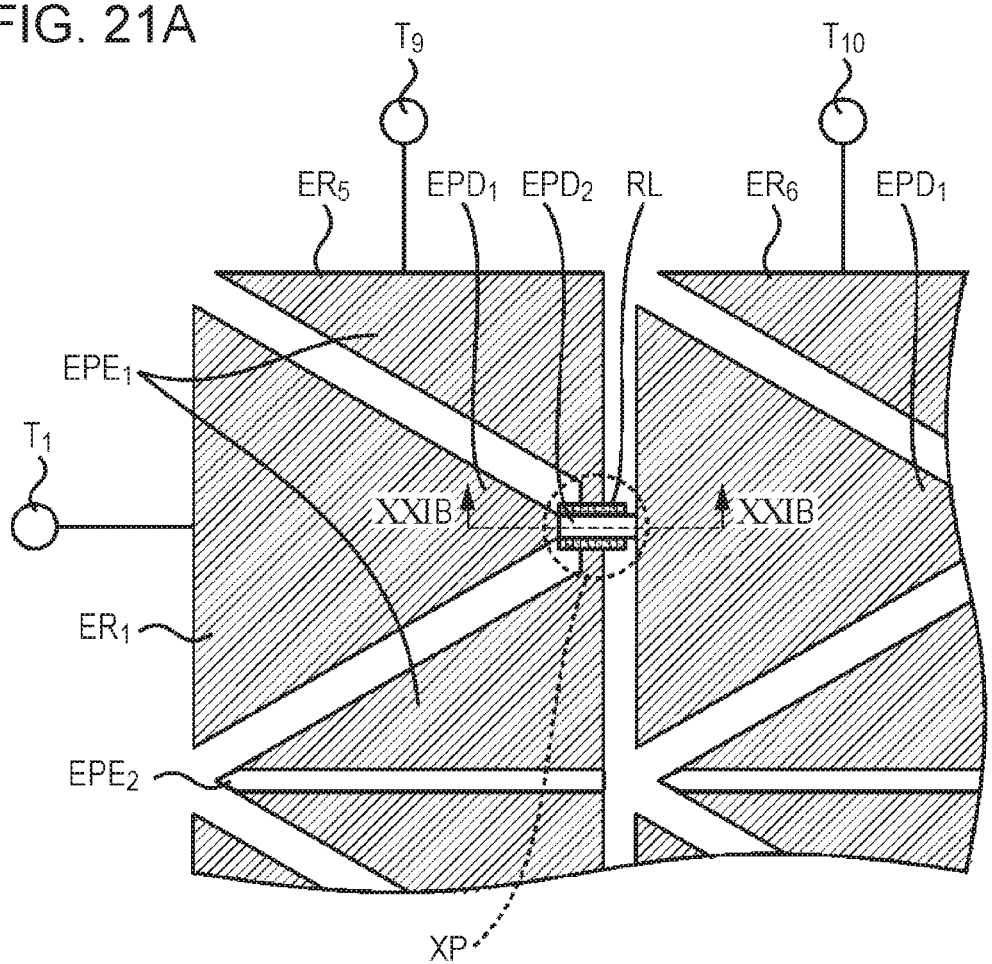
FIGS. 21A and 21B are enlarged views of an area around the intersection portion in the electrode pattern shown in FIG. 19B, where
Figure 21B:
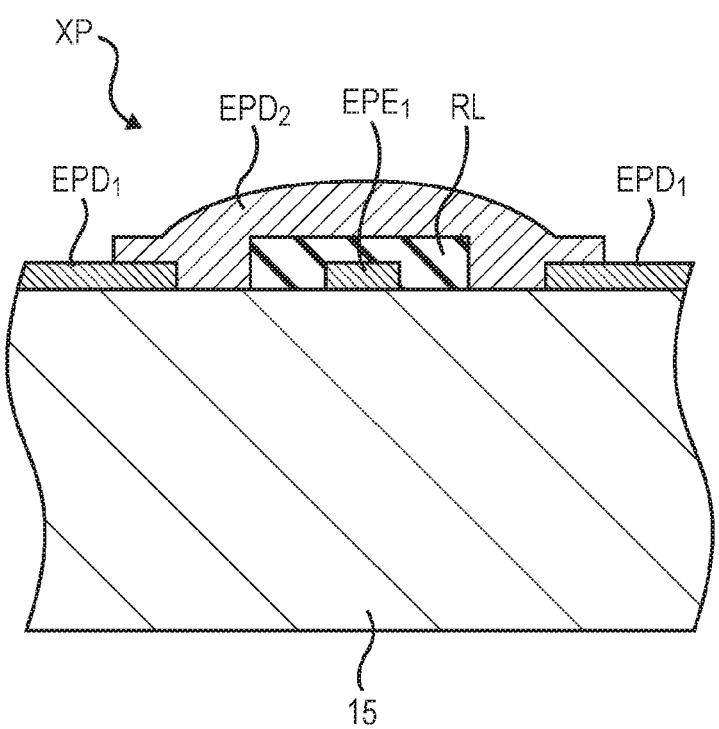

FIGS. 19A and 19B are diagrams showing an example of a pattern of electrodes in the input device according to the third embodiment. FIG. 19A shows 20 segments (A1 to A20) of an operation surface 11, and FIG. 19B shows a pattern of nine electrodes (ER1 to ER9) overlapping the respective segments A. FIGS. 20A and 20B are diagrams showing the details of the pattern of the electrodes (ER1 to ER9) shown in FIG. 19B. FIG. 20A shows a pattern of four electrodes (ER1 to ER4) passing through the upper portion of intersection portions XP, and FIG. 20B shows a pattern of five electrodes (ER5 to ER9) passing through the lower side of the intersection portions XP. FIGS. 21A and 21B are enlarged views of an area around the intersection portion XP in the electrode pattern shown in FIG. 19B. FIG. 21A is a plan view, and FIG. 21B is a cross-sectional view taken along a line XXIIB-XXIIB.

The matrix arrangement of the segments A, the directions in which ER1 to ER9 extend in the matrix arrangement of the segments A, etc., in the input device according to the present embodiment are generally the same as in the pattern of the electrodes shown in FIGS. 11A and 11B described above. A pattern of electrodes in the present embodiment is different from the pattern of the electrodes shown in FIGS. 11A and 11B, in the shapes of the electrodes within each segment A.

The electrodes ER1 to ER4 in the row direction each include, in one segment A, a first partial electrode EPD1 having a generally triangular shape, and a second partial electrode EPD2 extending thinly to the adjacent segment A. A base portion of the triangular shape of the first partial electrode EPD1 is located at one edge of the segment A in the row direction, and the top of the triangular shape opposing the base is located near the other edge of the segment A in the row direction. The second partial electrode EPD2 extends from the top of the triangular shape of the first partial electrode EPD1 to the other edge of the segment A in the row direction.

In one segment A, the electrodes ER5 to ER9 in the column direction each include a first partial electrode EPE1 formed so as to fill the gap between the above-described first partial electrode EPD1 and the segment A. In addition, the electrodes ER5 to ER9 each include a second partial electrode EPE2 formed between two segments A adjacent in the column direction so as to extend thinly in the row direction.

The electrodes ER1 to ER4 in the row direction and the electrodes ER5 to ER9 in the column direction intersect each other near the boundaries of the segments A at which the second partial electrodes EPD2 extend.

In the input device according to the present embodiment as well, similar to the second embodiment described above, since the first partial electrodes and the second partial electrodes are provided both the column-direction electrodes and the row-direction electrodes, electrodes ER having desired conductivity are easily formed in each of the column-direction electrodes and the row-direction electrodes.

Moreover, in the input device according to the present embodiment, the intersection portions XP are located near the boundaries of the segments A, and no intersection portions XP are present at the inner side away from the boundaries of the segments A. Accordingly, members having high conductivity like the third partial electrodes EPC3 in FIG. 18A do not have to intersect electrodes, and thus the configuration is simplified.

The present invention is not limited to the above-described embodiments. That is, a person skilled in the art may make various changes, combinations, sub-combinations, and alternations regarding the components of the above-described embodiments within the technical scope or the scope of the equivalents of the present invention.

What is claimed is:

1. An input device for inputting information corresponding to approach of an object to an operation surface thereof, the input device comprising:
   a plurality of electrodes each having a plurality of terminals such that the plurality of electrodes have N terminals in total, N being a natural number;
   a capacitance detection section configured to receive, from the N terminals of the plurality of electrodes, electric charges stored between the plurality of electrodes and the object approaching the operation surface, such that inputs of the electric charges from one of the plurality of electrodes are simultaneously received through the plurality of terminals of the electrode, and to generate detection data for each of the N terminals based on the inputs of the electric charges, thereby generating N pieces of detection data, the detection data corresponding to a capacitance between the electrode and the object approaching the operation surface; and
   an element data forming section configured to form M pieces of element data for M segments of the operation surface based on the N pieces of detection data, M being a natural number greater than N, each of the M pieces of element data indicating a degree of approach of the object to a corresponding one of the M segments, wherein the operation surface is virtually divided into the M segments such that each of the M segments overlaps one or more of the plurality of electrodes, thereby forming an overlapping portion in each electrode overlapping one of the M segments, such that partial electric charges are stored between the overlapping portion and the object approaching thereto, the partial electric charges being divided into respective distribution electric charges for the plurality of terminals of the electrode such that the distribution electric charges are simultaneously input to the capacitance detection section, whereby the partial electric charges are divided into the distribution electric charges in accordance with a respective conductance from the overlapping portion to each of the plurality of terminals, and
   wherein each of at least some of the plurality of electrodes includes:
      a plurality of first components each disposed within respective one of the M segments, the first components being formed of a first conductive material; and
      a plurality of second components each provided between adjacent two of the plurality of first components disposed within corresponding two of the M segments adjacent to each other, the second components being formed of a second conductive material having a lower conductivity than that of the first conductive material.

2. The input device according to claim 1, further comprising a substrate on which the plurality of electrodes are provided,
   wherein the plurality of electrodes include:
   at least one first electrode disposed on the substrate and extending in a first direction, and at least one second electrode disposed on the substrate and extending in a second direction crossing the first direction,
   thereby forming on the substrate at least one intersection portion at which the first and second electrodes intersect each other such that the first electrode is located closer to the substrate than the second electrode, and
   wherein at the intersection portion, one of the first components is provided to the first electrode.

3. The input device according to claim 2, wherein the second electrode is formed of the second conductive material.

4. The input device according to claim 2,
   wherein each of the M segments has a rectangular shape, such that the M segments are arranged in a matrix with rows and columns, the plurality of electrodes including:
      a plurality of row-direction electrodes extending in a row direction, which are the second electrodes extending in the second direction; and
      a plurality of column-direction electrodes extending in a column direction, which are the first electrodes extending in the first direction, each of the column-direction electrodes including the first components and the second components.

5. The input device according to claim 2, wherein the second electrode is provided with one of the second components at the intersection portion.

6. The input device according to claim 5,
   wherein each of the M segments has a rectangular shape, such that the M segments are arranged in a matrix with rows and columns, the plurality of electrodes including:

a plurality of row-direction electrodes extending in a row direction, which are the second electrodes extending in the second direction; and a plurality of column-direction electrodes extending in a column direction, which are the first electrodes extending in the first direction, each of the row-direction electrodes and each of the column-direction electrodes including the first components and the second components.

7. The input device according to claim 1,
wherein each of the M pieces of element data is represented as a sum of divided element data divided at a respective predetermined proportion so as to be distributed to the N pieces of detection data,
wherein each of the N pieces of detection data is approximated by a sum of the divided element data distributed thereto from the M pieces of element data,
wherein the element data forming section is further configured to repeat, a plurality of times:
calculating an assumed value of each of the N pieces of detection data as the sum of the divided element data distributed thereto with the respective predetermined proportion from assumed values of the M pieces of element data; and
correcting the assumed values of the M pieces of element data based on a set of N predetermined proportions for each of the M pieces of element data, such that the calculated assumed values of the N pieces of detection data approach actual values of the N pieces of detection data,
wherein the divided element data of one of the M segments is approximated by the distribution electric charges distributed to corresponding one of the N terminals, and
wherein the element data of one of the M segments is approximated by combined electric charges obtained by combining all of the partial electric charges stored at all of the overlapping portions of all the electrodes overlapping with the segment.

8. The input device according to claim 7, wherein the predetermined proportion for one of the N terminals with respect one of the plurality of electrodes and one of the M segments has a value corresponding to a first ratio of an area of the overlapping portion of the electrode overlapping the segment with respect to a total area of all of the overlapping portions of all of the electrodes overlapping the segment, and a second ratio of a conductance from the terminal to the overlapping portion of the electrode with respect to a total conductance from all of the terminals to the overlapping portion.

9. The input device according to claim 7, wherein the element data forming section is further configured to perform:
a first process of transforming the assumed values of the M pieces of element data to the assumed values of the N pieces of detection data based on the set of N predetermined proportions for each of the M pieces of element data;
a second process of calculating N first coefficients indicating multiplication factors for the assumed values of the N pieces of detection data to bring the assumed values of the N pieces of detection data multiplied by the multiplication factors to be equal to the actual values of the N pieces of detection data;
a third process of transforming the N first coefficients to M second coefficients indicating multiplication factors for the M pieces of element data based on the set of N predetermined proportions for each of the M pieces of element data; and
a fourth process of correcting the assumed values of the M pieces of element data based on the M second coefficients.

10. The input device according to claim 9, wherein the element data forming section is further configured to transform, in the first process, an M×1 matrix having the assumed values of the M pieces of element data as elements thereof into an N×1 matrix having the assumed values of the N pieces of detection data as elements thereof via a first transformation matrix having N×M elements corresponding to the predetermined proportions for the divided element data distributed from each of the M pieces of element data to the N pieces of detection data.

11. The input device according to claim 9, wherein the element data forming section is further configured to transform, in the third process, an N×1 matrix having the N first coefficients as elements thereof into an M×1 matrix having the M second coefficients as elements thereof via a second transformation matrix having M×N elements corresponding to the predetermined proportions for the divided element data distributed from each of the M pieces of element data to the N pieces of detection data.

* * * * *